US012628356B2

(12) United States Patent
Kalnitsky et al.

(10) Patent No.: US 12,628,356 B2
(45) Date of Patent: May 12, 2026

(54) MULTI-LATERAL RECESSED MIM STRUCTURE

(71) Applicant: Taiwan Semiconductor Manufacturing Company, Ltd., Hsinchu (TW)

(72) Inventors: Alexander Kalnitsky, San Francisco, CA (US); Ru-Liang Lee, Hsinchu (TW); Ming Chyi Liu, Hsinchu City (TW); Sheng-Chan Li, Tainan City (TW); Sheng-Chau Chen, Tainan City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 308 days.

(21) Appl. No.: 18/342,861

(22) Filed: Jun. 28, 2023

(65) Prior Publication Data

US 2023/0343817 A1     Oct. 26, 2023

Related U.S. Application Data

(62) Division of application No. 17/361,723, filed on Jun. 29, 2021, now Pat. No. 11,735,624.

(Continued)

(51) Int. Cl.
*H10D 1/00* (2025.01)
*H01L 21/768* (2006.01)
(Continued)

(52) U.S. Cl.
CPC ........... *H10D 1/042* (2025.01); *H01L 21/768* (2013.01); *H01L 23/5223* (2013.01);
(Continued)

(58) Field of Classification Search
CPC ........ H10D 1/042; H10D 1/716; H10D 1/714; H10B 12/0387; H10B 12/038; H10B 12/34
See application file for complete search history.

(56) References Cited

U.S. PATENT DOCUMENTS 5,240,871 A     8/1993   Doan et al.
5,753,948 A     5/1998   Nguyen et al.
(Continued)

FOREIGN PATENT DOCUMENTS

CN     106409812 A     2/2017
JP     2010238826 A     10/2010
(Continued)

OTHER PUBLICATIONS

Mellor, Chris."Extensive 3D NAND Drives Very Expensive to Make." The Register, published on Apr. 9, 2015.
(Continued)

*Primary Examiner* — Jose R Diaz
(74) *Attorney, Agent, or Firm* — Eschweiler & Potashnik, LLC

(57)     ABSTRACT

The present disclosure, in some embodiments, relates to an integrated chip. The integrated chip includes a dielectric stack disposed over a substrate. The dielectric stack has a first plurality of layers interleaved between a second plurality of layers. The dielectric stack has one or more surfaces that define a plurality of indentations recessed into a side of the dielectric stack at different vertical heights corresponding to the second plurality of layers. A capacitor structure lines the one or more surfaces of the dielectric stack. The capacitor structure includes conductive electrodes separated by a capacitor dielectric.

20 Claims, 17 Drawing Sheets

Related U.S. Application Data

(60) Provisional application No. 63/157,045, filed on Mar. 5, 2021.

(51) Int. Cl.
     H01L 23/522       (2006.01)
     H10D 1/68         (2025.01)
     H10F 39/00        (2025.01)

(52) U.S. Cl.
     CPC .............. H10D 1/714 (2025.01); H10D 1/716 (2025.01); H10F 39/802 (2025.01)

(56)                References Cited

U.S. PATENT DOCUMENTS

| | | | |
|---|---|---|---|
| 5,976,945 | A | 11/1999 | Chi et al. |
| 6,027,968 | A | 2/2000 | Nguyen et al. |
| 6,204,141 | B1 | 3/2001 | Lou |
| 6,624,018 | B1 | 9/2003 | Yu |
| 6,982,403 | B2 | 1/2006 | Yang et al. |
| 7,416,954 | B2 | 8/2008 | Block et al. |
| 10,090,287 | B1 * | 10/2018 | Adusumilli ............ H10D 1/716 |
| 10,461,148 | B1 | 10/2019 | Reznicek et al. |
| 2007/0224757 | A1 | 9/2007 | Cheng et al. |
| 2008/0145997 | A1 | 6/2008 | Tu |
| 2012/0012980 | A1 | 1/2012 | Horak et al. |
| 2012/0199949 | A1 | 8/2012 | Lan et al. |
| 2015/0102461 | A1 | 4/2015 | Lee |
| 2015/0145100 | A1 | 5/2015 | Hsu et al. |
| 2015/0187777 | A1 | 7/2015 | Hsu et al. |
| 2017/0033112 | A1 | 2/2017 | Cheng et al. |
| 2017/0110402 | A1 | 4/2017 | Smith et al. |
| 2017/0186837 | A1 | 6/2017 | Yen et al. |
| 2018/0040626 | A1 | 2/2018 | Zhu et al. |
| 2018/0269275 | A1 | 9/2018 | Ogino et al. |
| 2018/0323200 | A1 | 11/2018 | Tang |
| 2020/0066922 | A1 | 2/2020 | Cheng et al. |
| 2020/0083225 | A1 | 3/2020 | Ma et al. |
| 2021/0013143 | A1 | 1/2021 | Lu et al. |
| 2021/0288047 | A1 | 9/2021 | Lee et al. |
| 2022/0254714 | A1 | 8/2022 | Lu et al. |
| 2022/0285561 | A1 | 9/2022 | Lai et al. |

FOREIGN PATENT DOCUMENTS

| | | |
|---|---|---|
| KR | 20150052820 A | 5/2015 |
| TW | 381340 B | 2/2000 |

OTHER PUBLICATIONS

EE World. "Vertical Transistor NAND Flash Chip Technology May be Used in Advance." Published on Aug. 3, 2011.

U.S. Appl. No. 16/814,142, filed Mar. 10, 2020.

Non-Final Office Action dated Oct. 20, 2021 in connection with U.S. Appl. No. 16/814,142.

Notice of Allowance dated Feb. 2, 2022 in connection with U.S. Appl. No. 16/814,142.

Non-Final Office Action dated Nov. 8, 2022 for U.S. Appl. No. 17/361,723.

Notice of Allowance dated Apr. 5, 2023 for U.S. Appl. No. 17/361,723.

* cited by examiner

2100

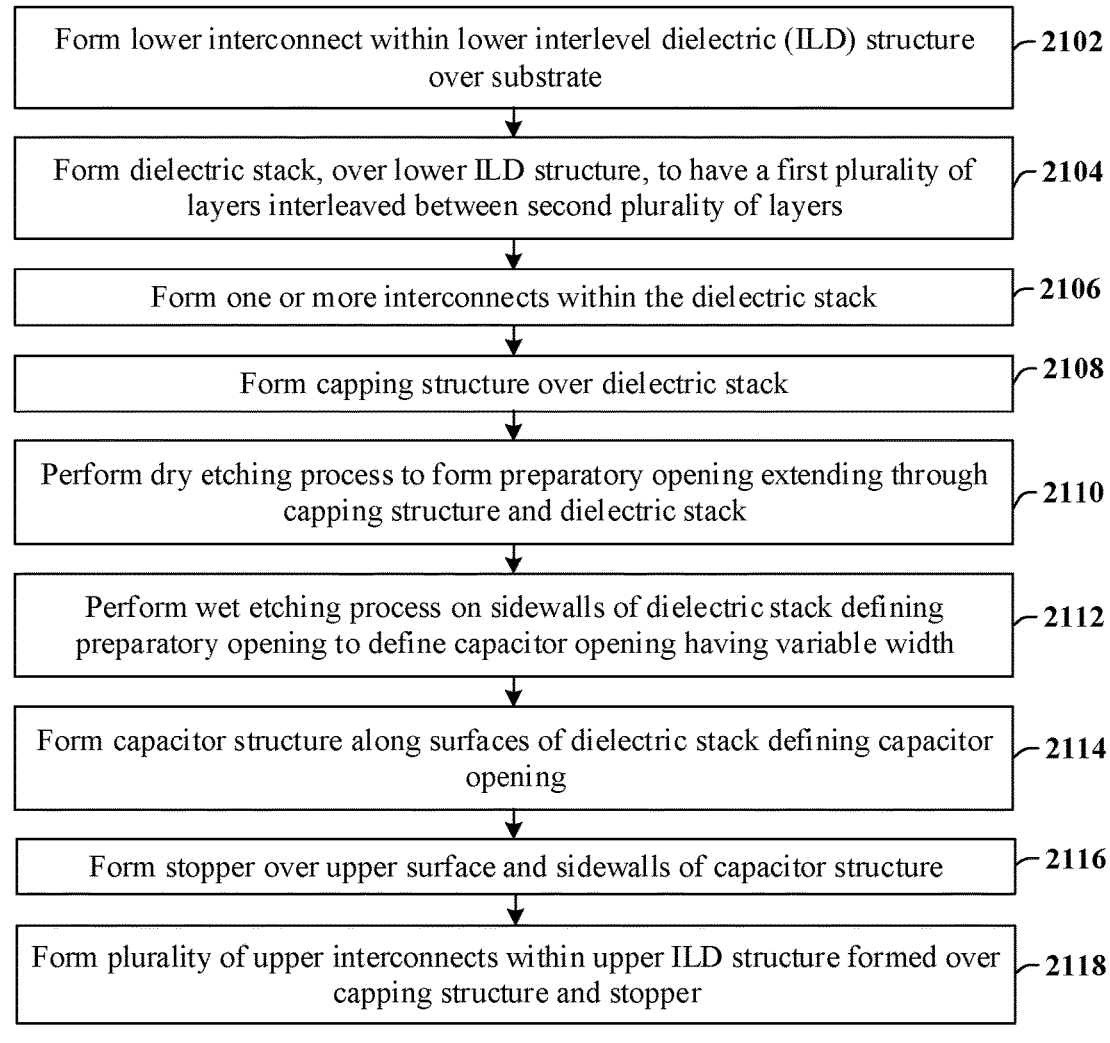

Form lower interconnect within lower interlevel dielectric (ILD) structure over substrate ⌐2102

Form dielectric stack, over lower ILD structure, to have a first plurality of layers interleaved between second plurality of layers ⌐2104

Form one or more interconnects within the dielectric stack ⌐2106

Form capping structure over dielectric stack ⌐2108

Perform dry etching process to form preparatory opening extending through capping structure and dielectric stack ⌐2110

Perform wet etching process on sidewalls of dielectric stack defining preparatory opening to define capacitor opening having variable width ⌐2112

Form capacitor structure along surfaces of dielectric stack defining capacitor opening ⌐2114

Form stopper over upper surface and sidewalls of capacitor structure ⌐2116

Form plurality of upper interconnects within upper ILD structure formed over capping structure and stopper ⌐2118

Fig. 21

MULTI-LATERAL RECESSED MIM STRUCTURE

REFERENCE TO RELATED APPLICATIONS

This application is a Divisional of U.S. application Ser. No. 17/361,723, filed on Jun. 29, 2021, which claims the benefit of U.S. Provisional Application No. 63/157,045, filed on Mar. 5, 2021. The contents of the above-referenced Patent Applications are hereby incorporated by reference in their entirety.

BACKGROUND

Integrated chips are formed on semiconductor die comprising millions or billions of transistor devices. The transistor devices are configured to act as switches and/or to produce power gains so as to enable logical functionality for an integrated chip (e.g., form a processor configured to perform logic functions). Integrated chips also comprise passive devices, such as capacitors, resistors, inductors, varactors, etc. Passive devices are widely used to control integrated chip characteristics, such as gains, time constants, etc.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 21 illustrates a flow diagram of some embodiments of a method of forming an integrated chip having a MIM capacitor structure within a capacitor opening having a variable width.

DETAILED DESCRIPTION

Figures 1, 2:
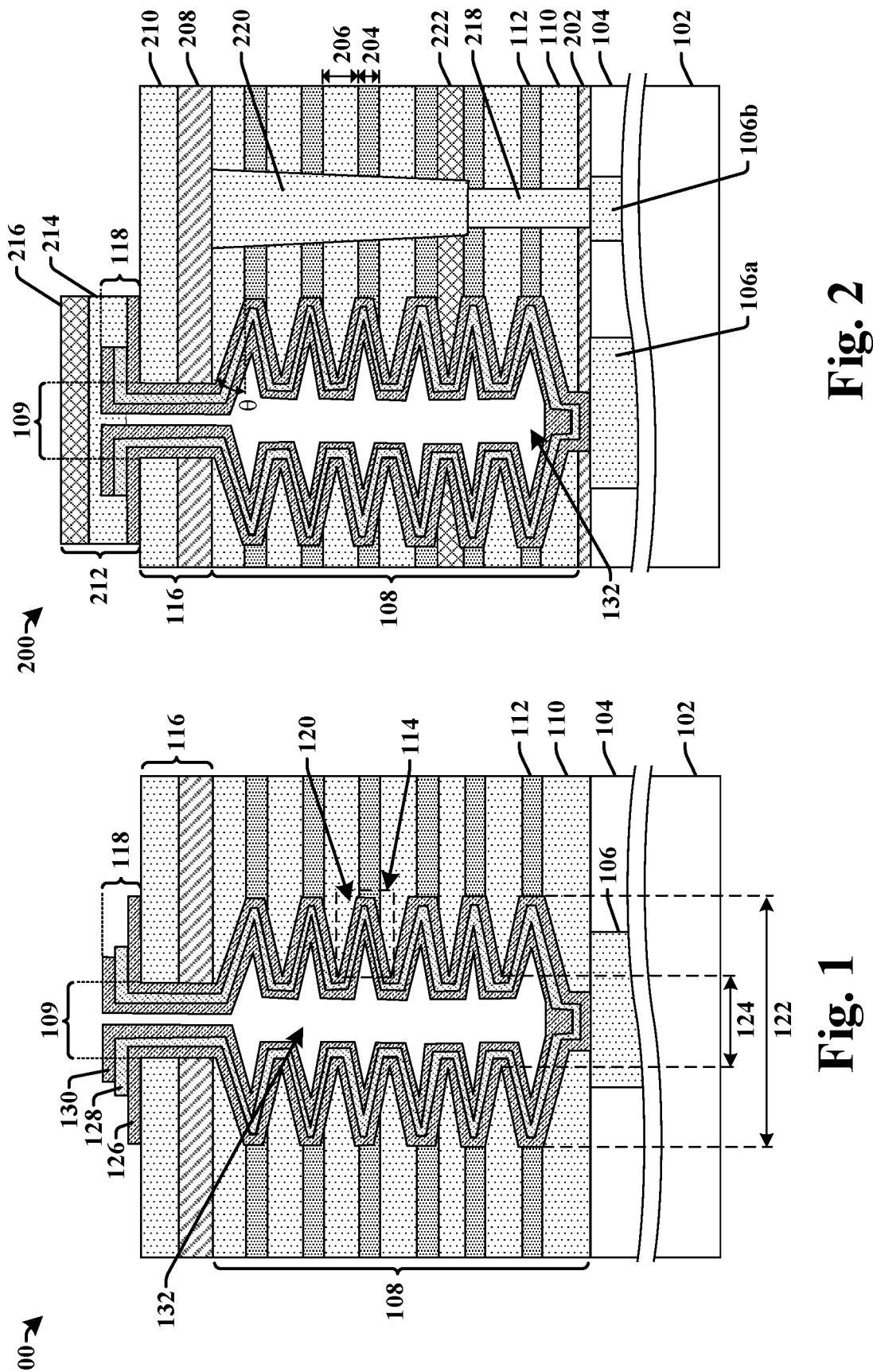
FIG. 1 illustrates a cross-sectional view of some embodiments of an integrated chip having a MIM (metal-insulator-metal) capacitor structure disposed within a capacitor opening having a variable width that oscillates between smaller and larger widths over a height of the capacitor opening.
FIG. 2 illustrates a cross-sectional view of some additional embodiments of an integrated chip having a MIM capacitor structure within a capacitor opening having a variable width.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A MIM (metal-insulator-metal) capacitor is a passive device that is typically arranged within a back-end-of-the line (BEOL) interconnect stack of an integrated chip. A MIM capacitor may be fabricated by performing an isotropic etching process on an inter-level dielectric (ILD) layer to form a trench within the ILD layer. A first electrode layer is deposited within the trench, a capacitor dielectric layer is deposited over the first electrode layer, and a second electrode layer is subsequently deposited over the capacitor dielectric layer. One or more patterning processes are performed to remove parts of the first electrode layer, the capacitor dielectric layer, and the second electrode layer from over the ILD layer and to define a MIM capacitor structure having a capacitor dielectric disposed between a first electrode and a second electrode.

MIM capacitors are widely used in many integrated circuits. For example, MIM capacitors may be used as decoupling capacitors to reduce high frequency noise in an integrated chip. MIM capacitors may also be used in image sensing circuits to reduce thermal noise (e.g., "kTC" noise), which may arise during reset operations on pixel regions. Because a capacitance of a MIM capacitor is directly proportional to an area of both the first electrode and the second electrode, MIM capacitors may consume a relatively large footprint (e.g., surface area) of an integrated chip to achieve capacitances used in integrated chip applications. For example, a MIM capacitor may have a footprint that is on the order of approximately 10 microns$^2$. Furthermore, while the minimum feature sizes of integrated chips (e.g., gate sizes, metal interconnect sizes, etc.) continue to decrease, a MIM capacitor is unable to similarly scale its size without decreasing its capacitance. Therefore, as the minimum features sizes of integrated chips decrease MIM capacitors are consuming proportionally larger areas of a substrate to achieve a same capacitance, and thus are becoming increasingly expensive.

The present disclosure relates to an integrated chip including a metal-insulator-metal (MIM) capacitor structure having a variable width that oscillates between smaller and larger widths over a height of the capacitor structure. In some embodiments, the integrated chip comprises a dielectric stack disposed over a substrate. The dielectric stack includes a first plurality of layers interleaved between a second plurality of layers. The dielectric stack has one or more surfaces that define a plurality of indentations recessed into a sidewall of the dielectric stack at different vertical heights corresponding to the second plurality of layers. A capacitor structure, comprising conductive electrodes separated by a capacitor dielectric, lines the one or more surfaces of the dielectric stack. Lining the one or more surfaces of the dielectric stack causes the capacitor structure to have a variable width. The variable width of the capacitor structure gives the conductive electrodes a relatively large surface area (e.g., a surface area that is larger than that of a capacitor structure within a trench with straight sidewalls). Since a capacitance of a capacitor is proportional to a surface area of the conductive electrodes, the relatively large surface area gives the capacitor structure a large capacitance without increasing an overall footprint of the capacitor structure.

FIG. 1 illustrates a cross-sectional view of some embodiments of an integrated chip 100 having a MIM (metal-insulator-metal) capacitor structure disposed within a capacitor opening having a variable width.

The integrated chip 100 comprises a lower inter-level dielectric (ILD) structure 104 over a substrate 102. In some embodiments, a plurality of lower interconnects 106 are disposed within the lower ILD structure 104. A dielectric stack 108 is disposed over the lower ILD structure 104. The dielectric stack 108 comprises a first plurality of layers 110 interleaved between a second plurality of layers 112. The first plurality of layers 110 comprise a first dielectric material that is configured to have a first etching rate when etched with an etchant. The second plurality of layers 112 comprise a second dielectric material that is configured to have a second etching rate, which is different than the first etching rate, when etched with the etchant. In some embodiments, a capping structure 116 may be disposed on an upper surface of the dielectric stack 108. The capping structure 116 comprises one or more dielectric materials that are different than the first dielectric material and the second dielectric material of the dielectric stack 108.

The dielectric stack 108 and the capping structure 116 comprise one or more surfaces that form a capacitor opening 109 that extends from an upper surface of the capping structure 116 to within the dielectric stack 108. The capacitor opening 109 comprises a plurality of indentations 114 that are vertically separated from one another, so as to cause the capacitor opening 109 to oscillate between smaller and larger widths over a height of the capacitor opening 109. The plurality of indentations 114 give a serrated profile to opposing edges of the dielectric stack 108 that define sides of the capacitor opening 109. In some embodiments, the different etching rates between the first dielectric material and the second dielectric material provide for an etching selectivity between the first plurality of layers 110 and the second plurality of layers 112. The etching selectivity may cause the plurality of indentations 114 to have outermost points (e.g., a maximum indentation and/or extensions) defined by the second plurality of layers 112. In such embodiments, the first plurality of layers 110 define upper and lower surfaces of the plurality of indentations 114, and a maximum width of the capacitor opening 109 is between sidewalls of one of the second plurality of layers 112.

A capacitor structure 118 lines the one or more surfaces of the dielectric stack 108 defining the capacitor opening 109. The capacitor structure 118 comprises a first electrode 126 separated from a second electrode 130 by a capacitor dielectric 128. Because the capacitor structure 118 lines the one or more surfaces of the dielectric stack 108 defining the capacitor opening 109, the capacitor structure 118 also comprises outer edges having serrated profiles. The serrated profiles of the capacitor structure 118 cause the capacitor structure 118 to oscillate between a plurality of first widths 122 and a plurality of second widths 124, which are different than the plurality of first widths 122, over a height of the capacitor structure 118. In some embodiments, the capacitor structure 118 has a first width directly between a first layer of the first plurality of layers 110 and a different second width directly between a second layer of the second plurality of layers 112. The capacitor structure 118 further comprises interior edges having a serrated profile. The interior edges of the capacitor structure 118 define a cavity 132 that separates the interior edges of the capacitor structure 118 from one another. The serrated profile of the interior edges also causes the cavity 132 to have a third width directly between sidewalls of a first layer of the first plurality of layers 110 and a different fourth width extending between sidewalls of a second layer of the second plurality of layers 112.

The variable width of the capacitor structures 118 gives both the first electrode 126 and the second electrode 130 a relatively large surface area (e.g., a surface area that is larger than that of a capacitor structure having straight sidewalls). Because a capacitance of the capacitor structure 118 is proportional to surface areas of the first electrode 126 and the second electrode 130, the relatively large surface areas of the first electrode 126 and the second electrode 130 allow the capacitor structure 118 to have a relatively large capacitance over a relatively small footprint of the substrate 102. For example, the disclosed capacitor structure can have a capacitance that is greater than twice (e.g., greater than 2.5 times) that of a capacitor structure having a same height but straight sidewalls. The relatively large capacitance allows for the capacitor structure 118 to improve a performance of the integrated chip 100 (e.g., by reducing noise).

FIG. 2 illustrates a cross-sectional view of some additional embodiments of an integrated chip 200 having a MIM capacitor structure within a capacitor opening having a variable width.

The integrated chip 200 comprises a plurality of lower interconnects 106a-106b disposed within a lower ILD structure 104 over a substrate 102. In some embodiments, the lower ILD structure 104 may comprise a plurality of stacked inter-level dielectric (ILD) layers. In some embodiments, the plurality of stacked ILD layers may comprise one or more of silicon dioxide, silicon nitride, carbon doped silicon dioxide, silicon oxynitride, borosilicate glass (BSG), phosphorus silicate glass (PSG), borophosphosilicate glass (BPSG), fluorosilicate glass (FSG), undoped silicate glass (USG), a porous dielectric material, or the like. In some embodiments, the one or more lower interconnects 106a-106b may comprise one or more of a middle-of-line (MOL) interconnect, a conductive contact, an interconnect wire, an interconnect via, or the like. In some embodiments, the one or more lower interconnects 106a-106b may comprise one or more of copper, tungsten, ruthenium, aluminum, and/or the like.

An etch stop layer 202 is disposed over the lower ILD structure 104. The etch stop layer 202 separates the lower ILD structure 104 from a dielectric stack 108 that overlies the lower ILD structure 104. In some embodiments, the etch stop layer 202 may comprise a nitride (e.g., silicon nitride), a carbide (e.g., silicon carbide), or the like. The dielectric stack 108 comprises a first plurality of layers 110 interleaved between a second plurality of layers 112. The first plurality of layers 110 comprise a first material and the second plurality of layers 112 comprise a second material having a different etching selectivity than the first material. In some embodiments, the first plurality of layers 110 may comprise an oxide, undoped silicate glass (USG), phosphosilicate glass (PSG), or the like. In some embodiments, the second plurality of layers 112 may comprise a nitride (e.g., silicon nitride, silicon oxynitride, etc.), a carbide (e.g., silicon carbide), boron silicate glass (BSG), borophosphosilicate glass (BPSG), or the like. For example, in some embodiments, the dielectric stack 108 may comprise interleaved layers of different silicate glasses (e.g., layers of PSG interleaved with layers of BSG). In some embodiments, the first plurality of layers 110 may have thicknesses 204 in a range of between approximately 5 nm and approximately 1 micron, between approximately 20 nm and approximately 200 nm, between approximately 10 nm and approximately 40 nm, or the like. In some embodiments, the second plurality of layers 112 may have thicknesses 206 in a range of between approximately 5 nm and approximately 1 micron, between approximately 20 nm and approximately 200 nm, between approximately 125 nm and approximately 250 nm, or the like. In some embodiments, the first plurality of layers 110 may have thicknesses that are less than thicknesses of the second plurality of layers 112.

A capping structure 116 is disposed on the dielectric stack 108. The capping structure 116 comprises one or more dielectric materials. In some embodiments, the capping structure 116 may comprise a first dielectric layer 208 and a second dielectric layer 210 disposed on the first dielectric layer 208. The first dielectric layer 208 is a different material than the second dielectric layer 210. In some embodiments, the first dielectric layer 208 may comprise a nitride (e.g., silicon nitride, silicon oxynitride, or the like) and the second dielectric layer 210 may comprise an oxide (e.g., silicon dioxide, or the like).

A capacitor opening 109 extends through the dielectric stack 108 and the capping structure 116. The capacitor opening 109 is defined by one or more interior surfaces of the dielectric stack 108 and/or the capping structure 116. A capacitor structure 118 is disposed along the interior surfaces of the dielectric stack 108 and/or the capping structure 116 defining the capacitor opening 109. The capacitor structure 118 comprises a first electrode 126 separated from a second electrode 130 by a capacitor dielectric 128. The capacitor structure 118 has exterior surfaces facing the dielectric stack 108. In some embodiments, one or more of the exterior surfaces are angled at an acute angle θ measured through the capacitor structure 118 and with respect to a line extending along a lower surface or an upper surface of the first plurality of layers 110. The capacitor structure 118 has interior surfaces that define a cavity 132 that oscillates between different widths over a height of the cavity 132. In some embodiments, one or more of the interior surfaces are angled at an acute angle measured through the cavity 132 and with respect to the line extending along the lower surface or the upper surface of the first plurality of layers 110.

In some embodiments, the first electrode 126 and the second electrode 130 may respectively comprise aluminum, copper, tantalum, titanium, tantalum nitride, titanium nitride, tungsten, and/or the like. In some embodiments, the first electrode 126 comprises a same metal as the second electrode 130, while in other embodiments the first electrode 126 and the second electrode 130 may comprise different metals. The first electrode 126 and the second electrode 130 respectively have a thickness that is in a range of between approximately 10 Angstroms (Å) and approximately 200 Å, between approximately 50 Å and approximately 1000 Å, or other similar values. In some embodiments, the capacitor dielectric 128 may comprise a high-k dielectric material. In some embodiments, the capacitor dielectric 128 may comprise one or more of aluminum oxide ($Al_2O_3$), hafnium oxide ($HfO_2$), silicon dioxide ($SiO_2$), silicon carbide (SiC), silicon mononitride (SiN), silicon nitride ($Si_3N_4$), tantalum nitride ($Ta_2O_5$), tantalum oxynitride (TaON), titanium oxide ($TiO_2$), zirconium oxide ($ZrO_2$), or the like. The capacitor dielectric 128 may have a thickness that is in a range of between approximately 5 Angstroms (Å) and approximately 500 Å, between approximately 10 Å and approximately 1000 Å, or other similar values.

The capacitor structure 118 extends from within the capacitor opening 109 to uppermost surfaces that are above an upper surface of the capping structure 116. The capacitor structure 118 comprises sidewalls that are arranged along a top of the cavity 132 and that are separated by the cavity 132. A stopper 212 is arranged over the uppermost surfaces and sidewalls of the capacitor structure 118. The stopper 212 covers the top of the cavity 132 that is between the sidewalls, so as to close (e.g., seal) the cavity 132. In some embodiments, the stopper 212 may comprise one or more dielectric materials. In some embodiments, the stopper 212 may comprise a first dielectric material 214 and an overlying second dielectric material 216. In some embodiments, the first dielectric material may comprise a carbide (e.g., silicon carbide, silicon oxycarbide, or the like). In some embodiments, the second dielectric material may comprise a nitride (e.g., silicon nitride, silicon oxynitride, or the like). In some embodiments, the stopper 212 may comprise a metal.

In some embodiments, an interconnect via 218 and an interconnect wire 220 are arranged within the dielectric stack 108 at positions that are laterally separated from the capacitor structure 118. The interconnect wire 220 contacts a top of the interconnect via 218. The interconnect via 218 and/or the interconnect wire 220 respectively and vertically extend through at least two of the first plurality of layers 110 and/or two of the second plurality of layers 112. In some embodiments, a second etch stop layer 222 is arranged within the dielectric stack 108. In some embodiments, the second etch stop layer 222 may be arranged between adjacent ones of the second plurality of layers 112. For example, the second etch stop layer 222 may continuously extend from a bottom surface contacting a first one of the second plurality of layers 112 to an upper surface contacting a second one of the second plurality of layers 112. In some such embodiments, a bottom of the interconnect wire 220 is vertically between a top of the second etch stop layer 222 and a bottom of the first one of the second plurality of layers 112.

Figures 3A, 3B:
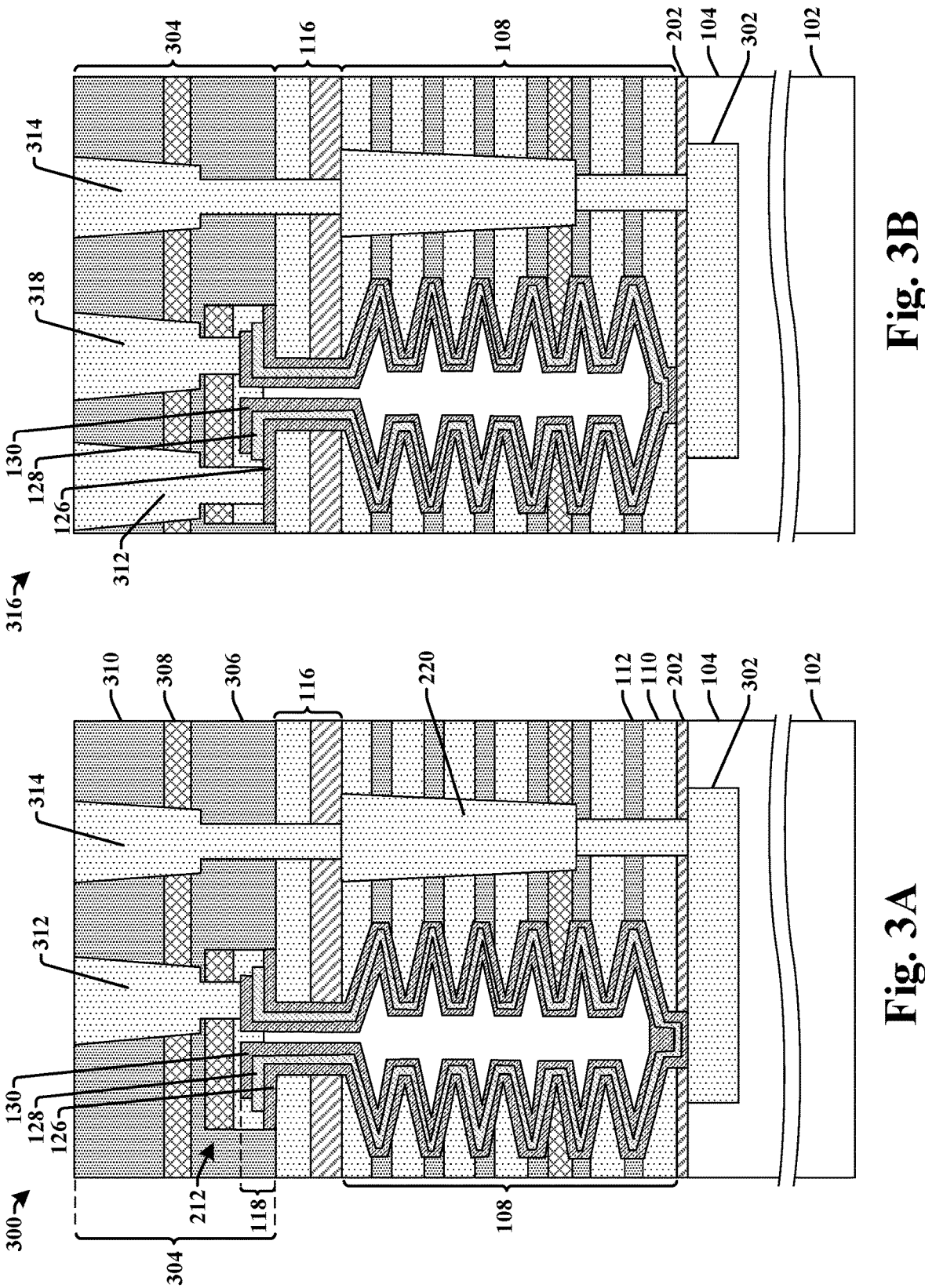
FIGS. 3A-3B illustrate cross-sectional views of some additional embodiments of integrated chips having MIM capacitor structures within capacitor openings having variable widths.

FIG. 3A illustrates a cross-sectional view of some additional embodiments of an integrated chip 300 having a MIM capacitor structure within a capacitor opening having a variable width.

The integrated chip 300 comprises a lower interconnect 302 disposed within a lower ILD structure 104 over a substrate 102. A capacitor structure 118 is disposed within a dielectric stack 108 over the lower ILD structure 104. The capacitor structure 118 comprises a first electrode 126 separated from a second electrode 130 by a capacitor dielectric 128.

In some embodiments, an etch stop layer 202 is arranged between the lower ILD structure 104 and the dielectric stack 108. In some embodiments, the capacitor structure 118 extends through the etch stop layer 202 to a bottom surface resting on the lower interconnect 302, so that the first electrode 126 is electrically coupled to the lower interconnect 302. In such embodiments, the etch stop layer 202 is arranged along sidewalls of the capacitor structure 118.

A capping structure 116 is disposed on the dielectric stack 108. An upper inter-level dielectric (ILD) structure 304 is arranged over the capacitor structure 118 and the capping structure 116. In some embodiments, the upper ILD structure 304 comprises a first upper ILD layer 306 separated from a second upper ILD layer 310 by an upper etch stop layer 308. In some such embodiments, the first upper ILD layer 306 and/or the second upper ILD layer 310 may comprise an oxide (e.g., PSG, USG, BSG, BPSG, or the like). In some embodiments, the upper etch stop layer 308 may comprise a nitride (e.g., silicon nitride, silicon oxynitride, or the like), a carbide (e.g., silicon carbide, silicon oxycarbide, or the like), or the like.

In some embodiments, a first upper interconnect 312 extends through the upper ILD structure 304 to contact the second electrode 130. In some additional embodiments, an additional upper interconnect 314 extends through the upper ILD structure 304 to contact an interconnect wire 220 disposed within the dielectric stack 108. In various embodiments, the first upper interconnect 312 and/or the additional upper interconnect 314 may comprise an interconnect wire and/or an interconnect via. In some embodiments, the additional upper interconnect 314 may vertically extend below a bottom of the first upper interconnect 312, so that the first upper interconnect 312 has a bottommost surface that is below a bottommost surface of the additional upper interconnect 314.

FIG. 3B illustrates a cross-sectional view of some additional embodiments of an integrated chip 316 having a MIM capacitor structure within a capacitor opening having a variable width.

The integrated chip 316 comprises an etch stop layer 202 that separates a dielectric stack 108 from a lower ILD structure 104 over a substrate 102. A capacitor structure 118 is disposed within the dielectric stack 108. The capacitor structure 118 comprises a first electrode 126 separated from a second electrode 130 by a capacitor dielectric 128. In some embodiments, the capacitor structure 118 has a bottommost surface that rests on an upper surface of the etch stop layer 202. A capping structure 116 is over the dielectric stack 108 and an upper ILD structure 304 is arranged over the capping structure 116.

A first upper interconnect 312 extends through the upper ILD structure 304 to contact the first electrode 126 of the capacitor structure 118 and a second upper interconnect 318 extends through the upper ILD structure 304 to contact the second electrode 130 of the capacitor structure 118, so that both the first electrode 126 and the second electrode 130 are contacted from an overlying interconnect. In some embodiments, an additional upper interconnect 314 may extend through the upper ILD structure 304 to contact an interconnect wire 220 within the dielectric stack 108. In some embodiments, the first upper interconnect 312, the second upper interconnect 318, and the additional upper interconnect 314 may comprise vias. In some embodiments, the additional upper interconnect 314 may vertically extend below bottoms of the first upper interconnect 312 and the second upper interconnect 318.

Figures 4, 5A:
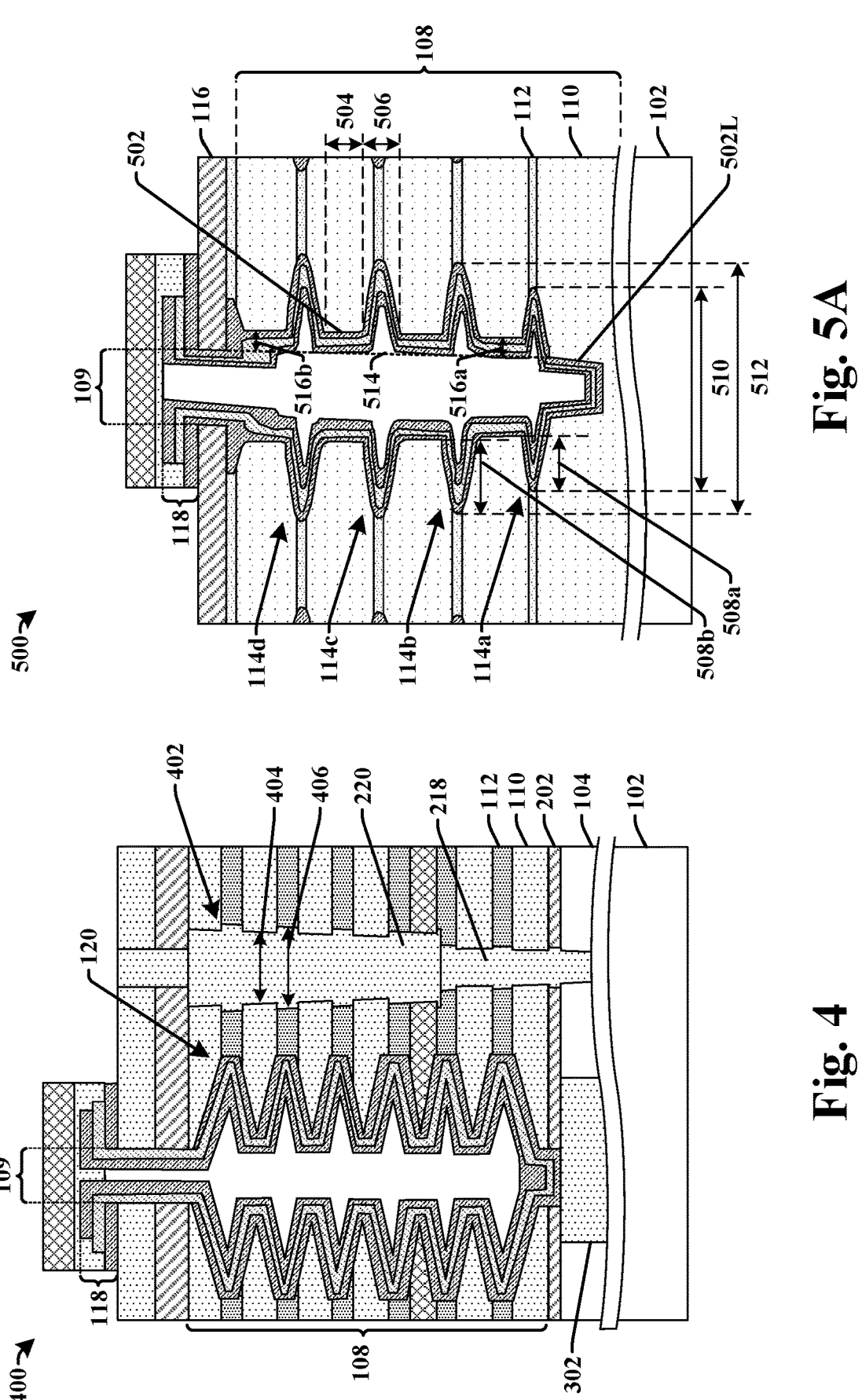
FIG. 4 illustrates a cross-sectional view of some additional embodiments of an integrated chip having a MIM capacitor structure within a capacitor opening having a variable width.
FIGS. 5A-5C illustrate cross-sectional views of some additional embodiments of integrated chips having a MIM capacitor structure within a capacitor opening having a variable width.

FIG. 4 illustrates a cross-sectional view of some additional embodiments of an integrated chip 400 having a MIM capacitor structure within a capacitor opening having a variable width.

The integrated chip 400 comprises a capacitor structure 118 disposed within a capacitor opening 109 in a dielectric stack 108 over a substrate 102. The dielectric stack 108 comprises a first plurality of layers 110 interleaved between a second plurality of layers 112. An interconnect via 218 and an interconnect wire 220 are also arranged within the dielectric stack 108 at positions that are laterally offset from the capacitor structure 118.

In some embodiments, the capacitor structure 118 has opposing sides with serrated profiles that define a plurality of protrusions 120 along the opposing sides of the capacitor structure 118. The serrated profiles give the capacitor structure 118 a width that oscillates over a height of the capacitor structure 118. In some embodiments, the interconnect via 218 and/or the interconnect wire 220 also have opposing sides with serrated profiles that define an additional plurality of protrusions 402 along the opposing sides of the interconnect via 218 and/or the interconnect wire 220. The serrated profiles cause the interconnect via 218 and/or the interconnect wire 220 to oscillate between a first plurality of widths 404 and a larger second plurality of widths 406 over a height of the interconnect via 218 and/or the interconnect wire 220, respectively. In some embodiments, the plurality of protrusions 120 of the capacitor structure 118 extend outward to a larger distance than the additional plurality of protrusions 402, so that a width of the capacitor structure 118 varies over a larger range of widths than the interconnect via 218 and/or the interconnect wire 220.

FIG. 5A illustrates a cross-sectional view of some additional embodiments of an integrated chip 500 having a MIM capacitor structure within a capacitor opening having a variable width.

The integrated chip 500 comprises a dielectric stack 108 disposed over a substrate 102. A capacitor structure 118 is disposed within a capacitor opening 109 in the dielectric stack 108. The capacitor opening 109 is defined by a plurality of indentations 114a-114d within the dielectric stack 108. The plurality of indentations 114a-114d are disposed at different vertical heights over the substrate 102 and are separated by vertically extending sidewalls 502 of the dielectric stack 108. In some embodiments, the plurality of indentations 114a-114d respective have a tapered height as viewed in the cross-sectional view of FIG. 4. The tapered height decreases as a lateral distance from a center of the capacitor opening 109 increases and/or as a lateral distance from the vertically extending sidewalls 502 increases. In some embodiments, the plurality of indentations 114a-114d have a rounded profile as viewed along the cross-sectional view, thereby giving the plurality of indentations 114a-114d a curved triangular profile.

In some embodiments, the vertically extending sidewalls 502 of the dielectric stack 108 may have a height 504 that is in a range of between approximately 75 nm and approximately 100 nm, between approximately 80 nm and approximately 95 nm, or other similar values. In some embodiments, the plurality of indentations 114a-114d may respectively have heights 506 in a range of between approximately 25 nm and approximately 100 nm, between approximately 40 nm and approximately 90 nm, or other similar values.

In some embodiments, the plurality of indentations 114a-114d have depths 508a-508b that increase as a vertical distance from the substrate 102 increases. For example, in some embodiments, a first indentation 114a may extend to a first depth 508a from an adjacent sidewall and an overlying second indentation 114b may extend to a second depth 508b form an adjacent sidewall that is greater than the first depth 508a. The different depths 508a-508b of the plurality of indentations 114a-114d give the capacitor structure 118 an increasing width as a height over the substrate 102 increases. For example, the first depth 508a of the first indentation 114a gives the capacitor structure 118 a first width 510 and the second depth 508b of the second indentation 114b gives the capacitor structure 118 a second width 512 that is larger than the first width 510.

In some embodiments, a capping structure 116 is arranged over the dielectric stack 108. The capping structure 116 has an interior sidewall defining a top of the capacitor opening 109. In some embodiments, the interior sidewall is substantially aligned along a line 514 with a lowest sidewall 502L of the dielectric stack 108 defining the capacitor opening 109. In such embodiments, overlying sidewalls of the capacitor opening 109 are separated from the line 514 by non-zero distances 516a-516b. In some embodiments, the non-zero distances 516a-516b increase as a height over the substrate 102 increases (e.g., non-zero distance 516a may be smaller than non-zero distance 516b).

Figure 5B:
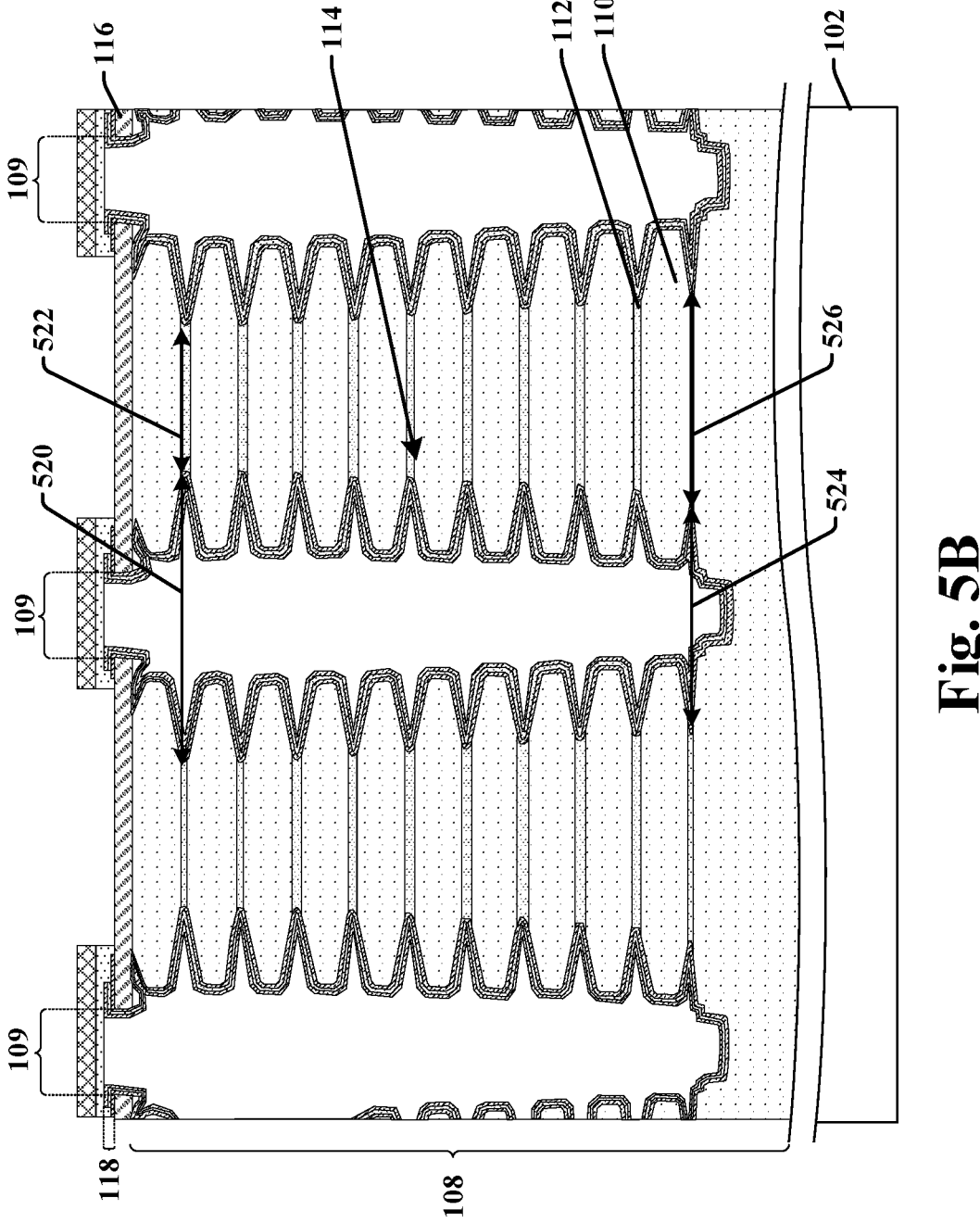

FIG. 5B illustrates a cross-sectional view of some additional embodiments of an integrated chip 518 having MIM capacitor structures within capacitor openings having a variable width.

The integrated chip 518 comprises a plurality of capacitor openings 109 within a dielectric stack 108 over a substrate 102. The plurality of capacitor openings 109 are respectively defined by a plurality of indentations 114 having a rounded profile as viewed along the cross-sectional view, thereby giving respective ones of the plurality of indentations 114 a curved triangular profile. Capacitor structures 118 are disposed within the plurality of capacitor openings 109 in the dielectric stack 108.

The plurality of capacitor openings 109 are separated from one another by the dielectric stack 108. In some embodiments, the plurality of capacitor openings 109 may respectively have a maximum width 520 that extends between outermost edges of a capacitor opening of the plurality of capacitor openings 109. A ratio of a minimum separation distance 522 from the capacitor opening to an adjacent one of the plurality of capacitor openings 109 to the maximum width 520 of a capacitor opening (e.g., a ratio of 522:520) may be less than 1, in a range of between approximately 0.4 and approximately 0.8, between approximately 0.5 and less than 1, or other similar values. In some embodiments, the ratio of the minimum separation distance 522 from the capacitor opening to an adjacent one of the plurality of capacitor openings 109 to the maximum width 520 of a capacitor opening (e.g., the ratio of 522:520) decreases as a distance over the substrate 102 increases. For example, in some embodiments, a ratio between the minimum separation distance 522 and the maximum width 520 is less than a ratio between separation distance 526 and width 524. In some embodiments, the maximum width 520 and/or the width 524 may be between 400 nm and 700 nm. In some embodiments, the minimum separation distance 522 and/or the separation distance 526 is between approximately 300 nm and approximately 600 nm.

Figure 5C:
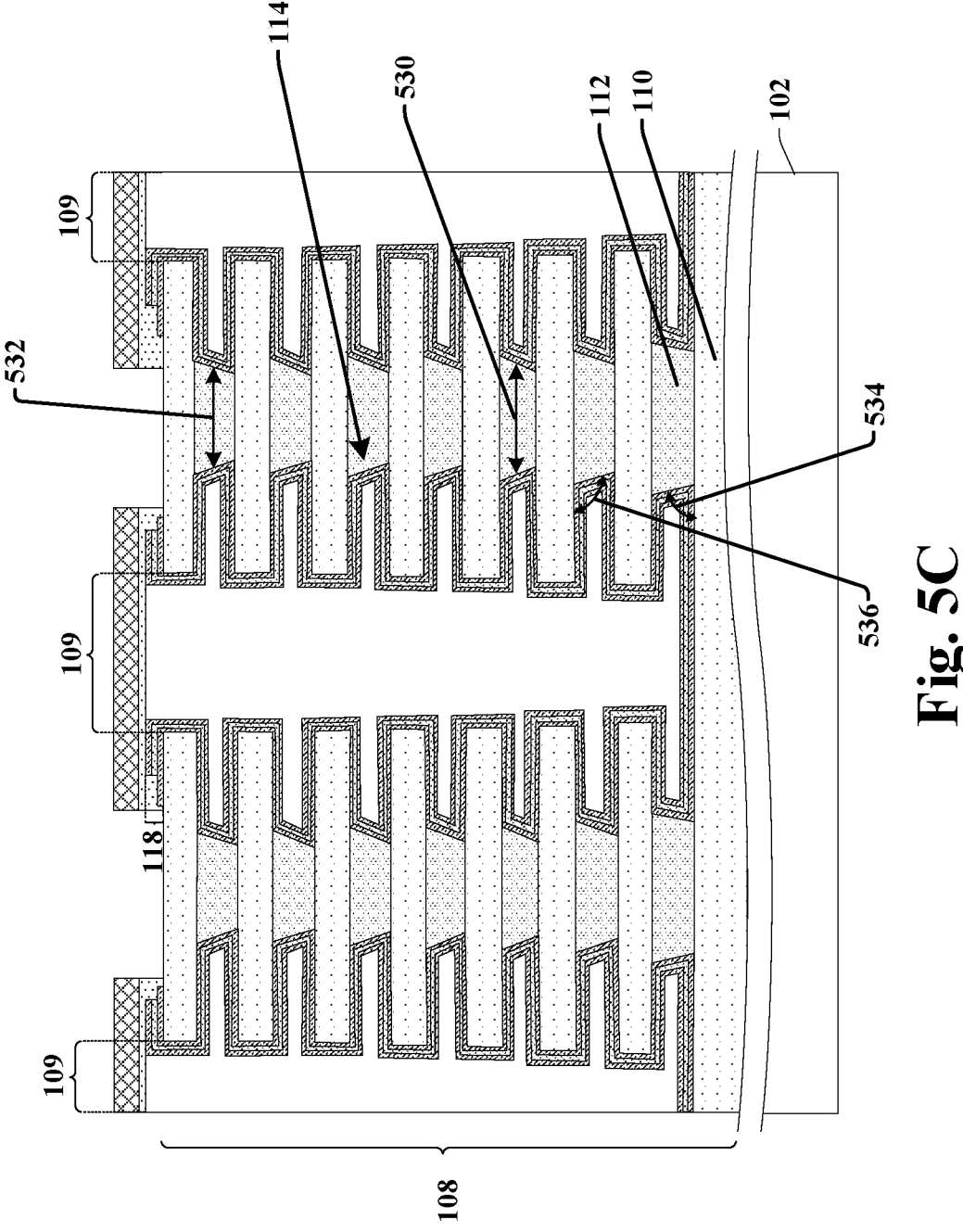

FIG. 5C illustrates a cross-sectional view of some additional embodiments of an integrated chip 528 having a MIM capacitor structure within a capacitor opening having a variable width.

The integrated chip 528 comprises a plurality of capacitor openings 109 within a dielectric stack 108 over a substrate 102. The plurality of capacitor openings 109 are respectively defined by a plurality of indentations 114 defined by substantially flat surfaces as viewed along the cross-sectional view, thereby giving respective ones of the plurality of indentations 114 a polygonal shaped indentation. A capacitor structure 118 is disposed within plurality of capacitor openings 109.

In some embodiments, the dielectric stack 108 comprises a first plurality of layers 110 interleaved between a second plurality of layers 112. The first plurality of layers 110 comprise a first dielectric material and the second plurality of layers 112 comprise a second dielectric material. In some embodiments, the first plurality of layers 110 respectively comprise a substantially rectangular shaped segments disposed along opposing sides of a capacitor opening as viewed in the cross-sectional view. In some embodiments, the second plurality of layers 112 respectively comprise inverted trapezoidal shaped segments disposed along opposing sides of a capacitor opening as viewed in the cross-sectional view. In some embodiments, a width of the inverted trapezoidal shaped segments may decrease as a distance from the substrate 102 increases. For example, in some embodiments a first trapezoidal shaped segment may have a first width 530 that is larger than a second width 532 of an overlying second trapezoidal shaped segment.

In some embodiments, the plurality of indentations 114 may respectively be defined by an angled substantially flat sidewall disposed between a substantially flat upper surface of an underlying layer and a substantially flat lower surface of an overlying layer. In some embodiments, the substantially flat lower surface may be angled at an acute angle 534 with respect to the angled substantially flat sidewall (as measured through the capacitor structure 118) and the substantially flat upper surface may be angled at an obtuse angle 536 with respect to the angled substantially flat sidewall (as measured through the capacitor structure 118).

Figure 6A:
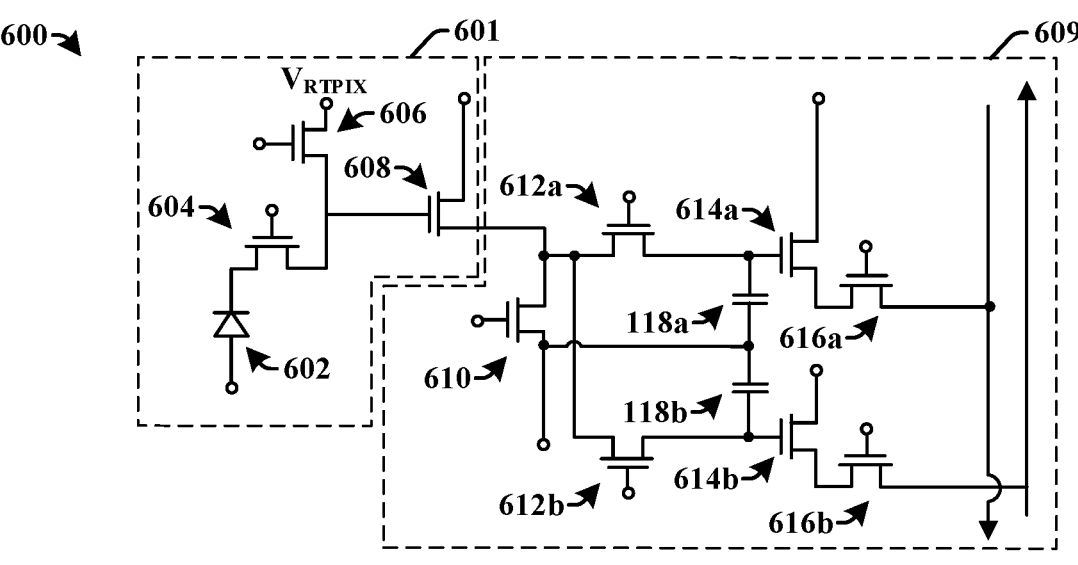
FIGS. 6A-6B illustrate some embodiments of an image sensor integrated chip having a MIM capacitor structure within a capacitor opening having a variable width.
Figure 6B:
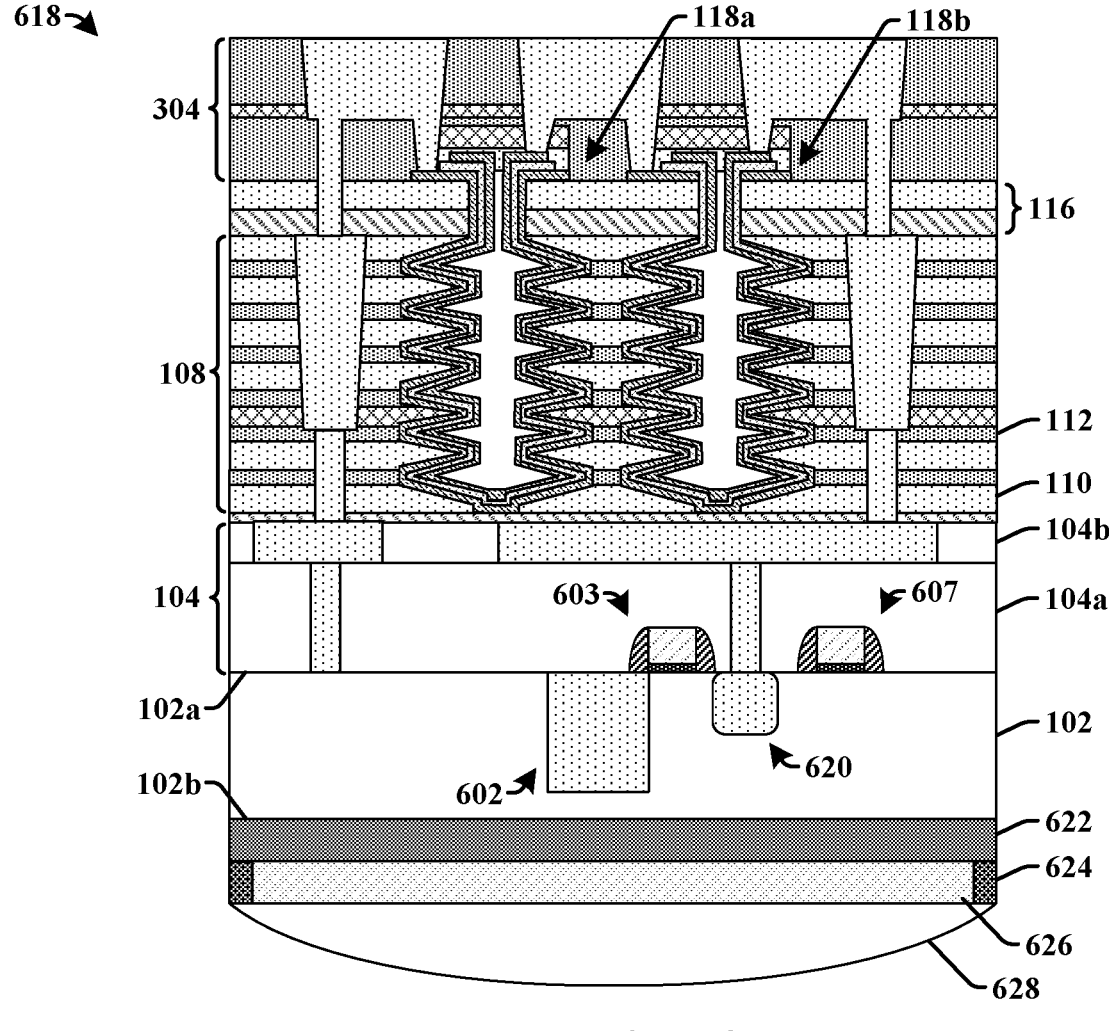

FIGS. 6A-6B illustrate some embodiments of an image sensor integrated chip having a MIM capacitor structure within a capacitor opening having a variable width.

FIG. 6A illustrates some embodiments of an exemplary schematic diagram of an image sensing circuit 600.

The image sensing circuit 600 comprises a pixel region 601 and a readout region 609. The pixel region 601 comprises a transfer transistor 604 coupled to an image sensing element 602 (e.g., a photodiode). The transfer transistor 604 is further coupled to a reset transistor 606 and a source-follower transistor 608. The source-follower transistor 608 is coupled to the readout region 609. The readout region 609 comprises a load transistor 610 coupled to a plurality of different branches coupled to bus lines. The plurality of branches respectfully comprise a select transistor 612a-612b coupled to a read transistor 616a-616b by a capacitor 118a-118b and a transistor 614a-614b.

During operation, the pixel region 601 is configured to be reset before the pixel starts to integrated charges. A reset operation may be performed by activating the reset transistor

606 to allow a reset voltage $V_{RTPIX}$ to reach the image sensing element 602. The image sensing element 602 (e.g., photodiode) may be susceptible to "kTC" noise, which may be introduced into the image sensing element 602 during a reset option. For example, thermal noise ("kTC" noise) in a channel of the reset transistor 606 may provide a variable amount of charge to the image sensing element 602 during a reset operation. A magnitude of "kTC" noise is related to the Boltzmann constant (k), a temperature in Kelvin (T), and a capacitance (C) in the current path.

The capacitors 118a-118b are configured to reduce "kTC" noise within the image sensing circuit 600. The larger the capacitance of the capacitors 118a-118b, the lower the "kTC" noise will be in the output signal on the bus lines. For example, a capacitor having a capacitance of 10 fF (femto Farads) will result in noise having a value that is approximately 4 times greater than a capacitor having a value of 160 fF. Therefore, the relatively large capacitance of the disclosed capacitor structure is able to reduce "kTC" noise within the image sensing circuit 600.

FIG. 6B illustrates a cross-sectional view of an image sensor integrated chip 618 comprising a disclosed capacitor structure.

The image sensor integrated chip 618 comprises a dielectric structure disposed along a first side 102a of a substrate 102. The dielectric structure comprises a dielectric stack 108 disposed between a lower ILD structure 104 and an upper ILD structure 304. In some embodiments, the lower ILD structure 104 may comprise a first lower ILD layer 104a and a second lower ILD layer 104b. The dielectric stack 108 comprises a first plurality of layers 110 interleaved between a second plurality of layers 112. A capacitor structure 118 extends through the dielectric stack 108.

An image sensing element 602 is disposed within the substrate 102. In some embodiment, the image sensing element 602 may comprise a photodiode including a first region having a first doping type (e.g., n-type doping) and an adjoining second region having a second doping type (e.g., p-type doping) that is different than the first doping type. A plurality of transistor gate structures, 603 and 607, are arranged along the first-side 102a of the substrate 102. In some embodiments, the plurality of transistor gate structures, 603 and 607, may correspond to a transfer transistor (e.g., 604 of FIG. 6A), a source-follower transistor (e.g., 608 of FIG. 6A). The plurality of transistor gate structures, 603 and 607, have a gate dielectric layer disposed along the first side 102a of the substrate 102 and a gate electrode arranged on the gate dielectric layer. In some embodiments, sidewall spacers are arranged on opposing sides of the gate electrode.

In some embodiments, a transistor gate structure 603 corresponding to a transfer transistor is laterally arranged between the image sensing element 602 and a floating diffusion well 620. The transistor gate structure 603 is configured to control the transfer of charge from the image sensing element 602 (e.g., photodiode) to the floating diffusion well 620. If a charge level is sufficiently high within the floating diffusion well 620, a transistor gate structure 607 corresponding to a source-follower transistor is activated and charges are selectively output according to operation of a row select transistor (not shown) used for addressing. A reset transistor (not shown) is configured to reset the image sensing element 602 (e.g., photodiode) between exposure periods.

A dielectric planarization structure 622 may be arranged along the second side 102b of the substrate 102. The dielectric planarization structure 622 has a substantially planar surface facing away from the substrate 102. In various embodiments, the dielectric planarization structure 622 may comprise one or more stacked dielectric layers. For example, in some embodiments, the dielectric planarization structure 622 may comprise a first dielectric layer comprising a first material and a second dielectric layer stacked onto the first dielectric layer and comprising a second material. In some embodiments, the first material and/or the second material may comprise an oxide (e.g., $SiO_2$) or a nitride, for example.

A grid structure 624 is disposed on the dielectric planarization structure 622. In various embodiments, the grid structure 624 may comprise a metal (e.g., aluminum, cobalt, copper, silver, gold, tungsten, etc.) and/or a dielectric material (e.g., $SiO_2$, SiN, etc.). A color filter 626 is arranged within an opening in the grid structure 624. The color filter 626 is configured to selectively transmit specific wavelengths of incident radiation. For example, the color filter 626 may transmit radiation having wavelengths within a first range (e.g., corresponding to green light), while a second color filter (not shown) may transmit radiation having wavelengths within a second range (e.g., corresponding to red light) different than the first range, etc. A micro-lens 628 is arranged over the color filter 626. The micro-lens 628 is laterally aligned with the color filter 626 and is configured to focus the incident radiation (e.g., light) towards the image sensing element 602.

Figure 7:
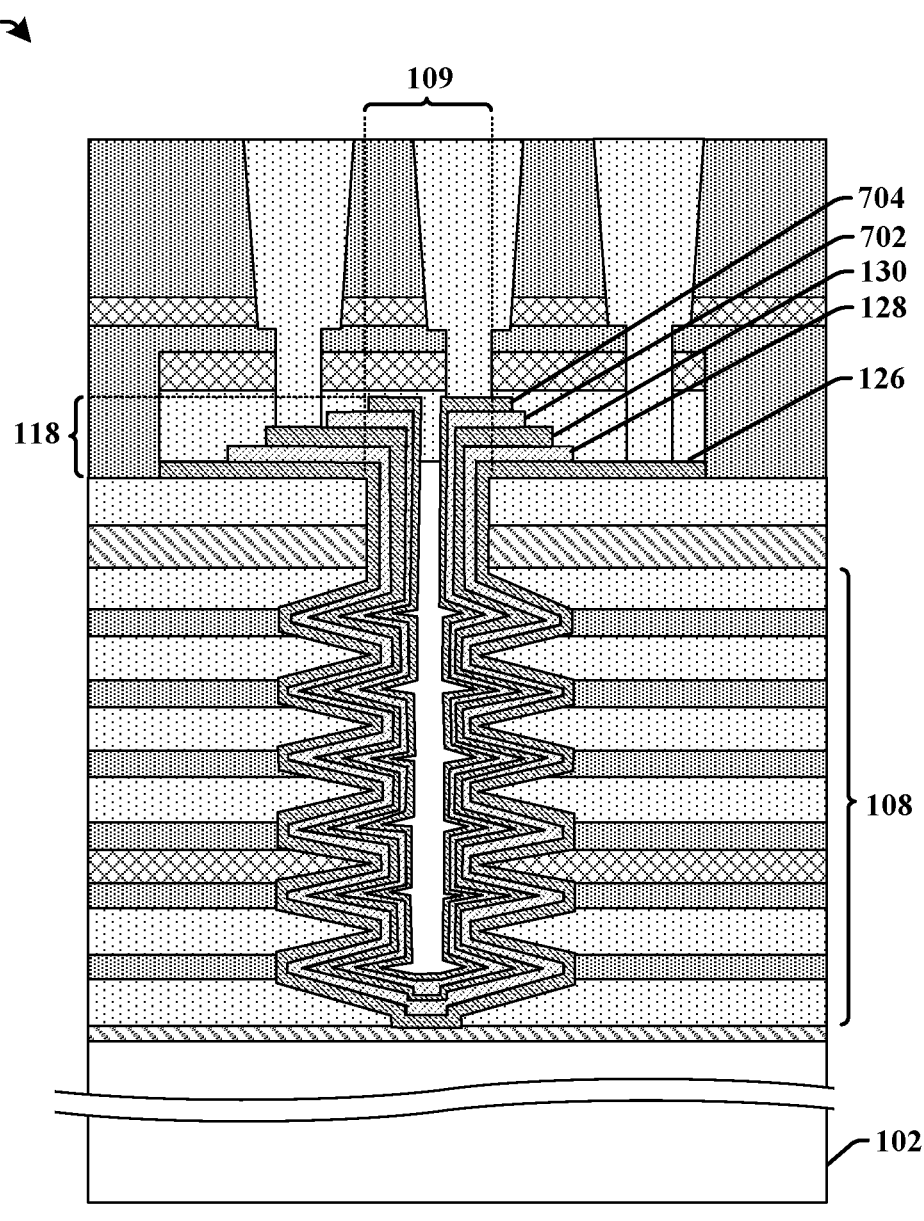
FIG. 7 illustrates a cross-sectional view of some additional embodiments of an integrated chip having multiple MIM capacitor structures within a capacitor opening having a variable width.

FIG. 7 illustrates a cross-sectional view of some additional embodiments of an integrated chip 700 having a MIM capacitor structure having multiple MIM structures within a capacitor opening having a variable width.

The integrated chip 700 comprises a capacitor structure 118 disposed within a capacitor opening 109 within a dielectric stack 108 over a substrate 102. The capacitor structure 118 comprises a first electrode 126 separated from a second electrode 130 by a capacitor dielectric 128. The second electrode 130 of the capacitor structure 118 is further separated from a third electrode 704 by a second capacitor dielectric 702. The first electrode 126, the second electrode 130, the third electrode 704, the capacitor dielectric 128, and the second capacitor dielectric 702 respectively have serrated surfaces defining protrusions.

In some embodiments, the first electrode 126 and the third electrode 704 may be coupled to a same node within a circuit. In other embodiments the first electrode 126 and the third electrode 704 may be coupled to different nodes within a circuit. Although the integrated chip 700 of FIG. 7 illustrates a disclosed capacitor structure having three electrodes, it will be appreciated that in other embodiments the disclosed capacitor structure may have more than three electrodes (e.g., four electrodes, five electrodes, etc.).

Figure 8A:
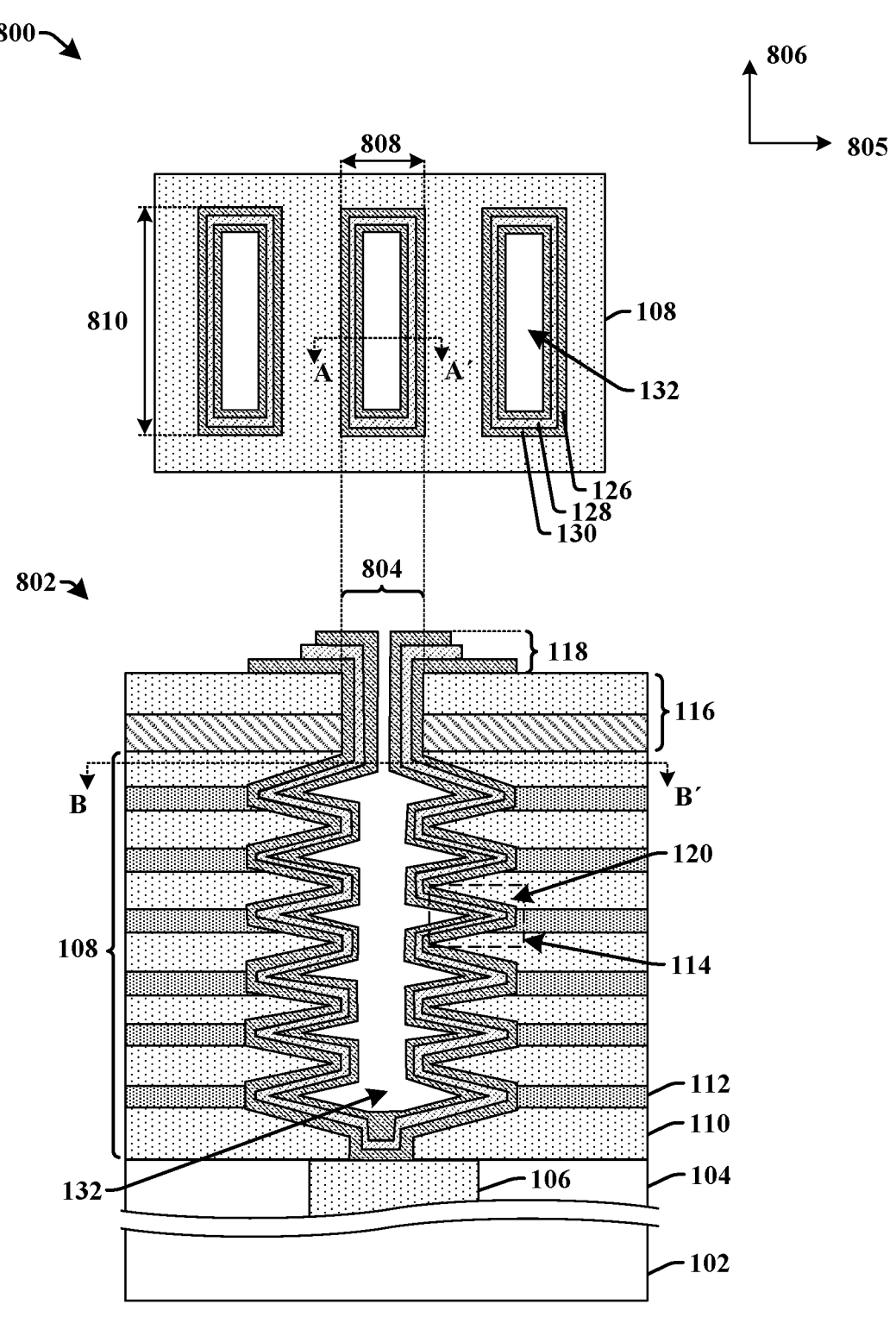
FIGS. 8A-8C illustrate some embodiments of integrated chips having MIM capacitor structures within capacitor openings having different shapes.
Figure 8B:
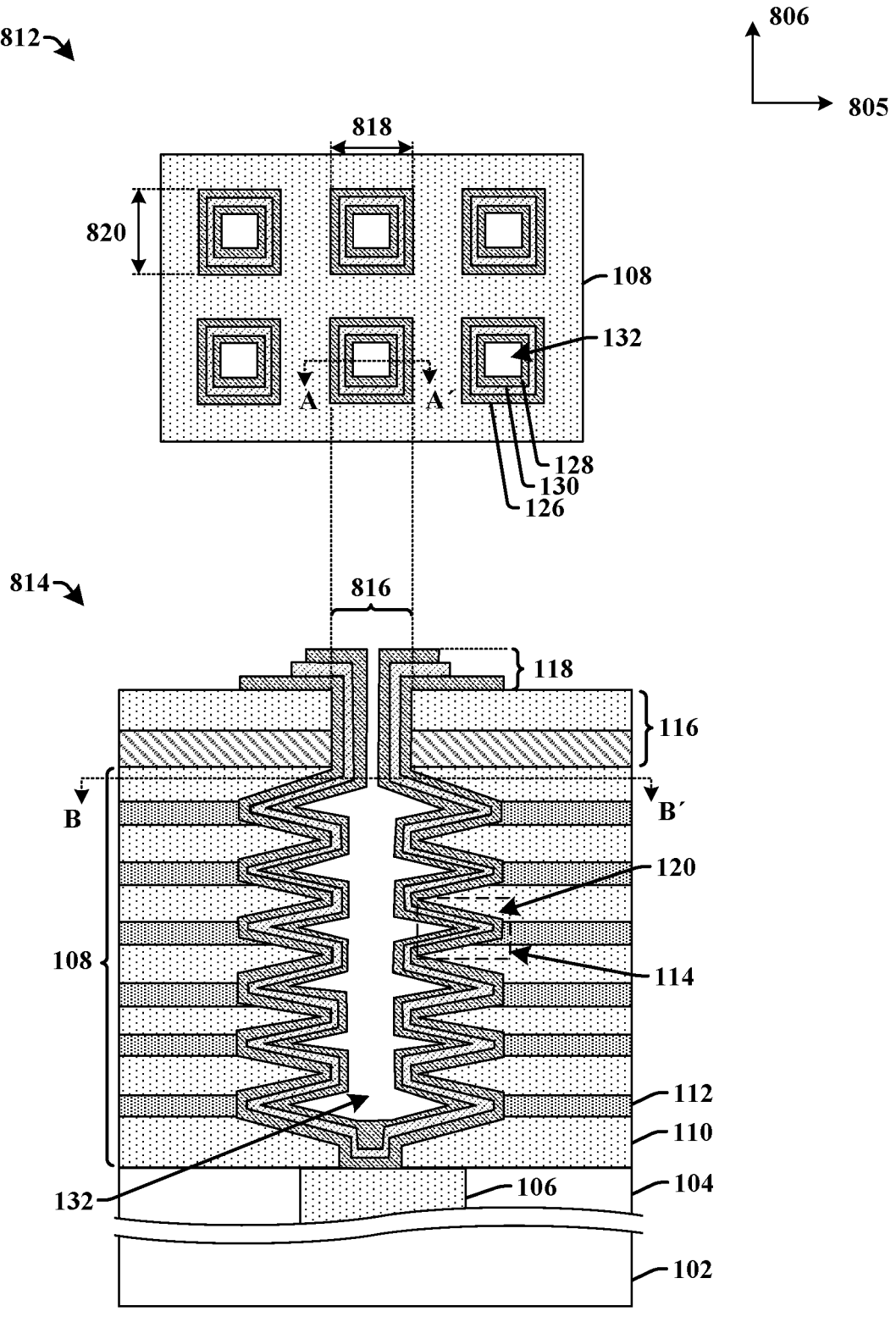
Figure 8C:
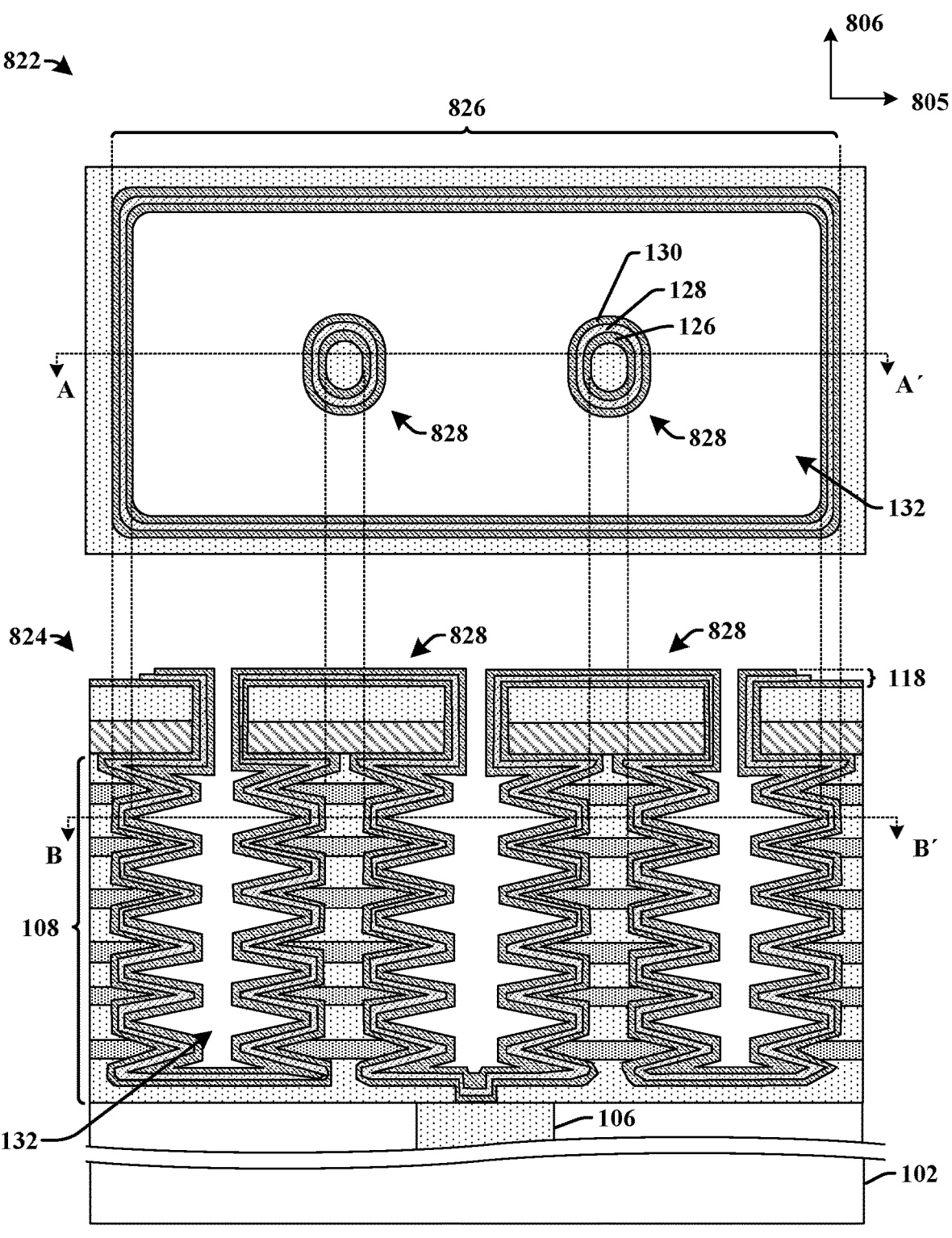

Furthermore, it will be appreciated that the disclosed capacitor structure may be disposed within a capacitor opening having various shapes in various embodiments. The various shapes allow for the disclosed capacitor structure to have different capacitances and/or to meet different design requirements. FIGS. 8A-8C illustrate some embodiments of capacitor structures disposed within capacitor openings having different shapes. Although FIGS. 8A-8C illustrates capacitor structures having certain shapes, it will be appreciated that the illustrated shapes are only examples and that other shapes are also believed to fall within the scope of this disclosure.

FIG. 8A illustrates some embodiments of an integrated chip having a disclosed capacitor structure arranged within a trench-type capacitor opening.

As shown in top view 800 (taken along line B-B') and cross-sectional view 802 (taken along line A-A') of FIG. 8A, a capacitor structure 118 is arranged within a capacitor opening 804 within a dielectric stack 108 over a substrate 102. The capacitor structure 118 surrounds a cavity 132. The capacitor opening 804 has a trench shape that extends in a first direction 805 for a first distance 808 and in a second direction 806 for a second distance 810 that is greater than the first distance 808. The first direction 805 is substantially perpendicular to the second direction 806 and is substantially parallel to an upper surface of the dielectric stack 108. In some embodiments, the integrated chip may comprise an array of capacitor structures 118 arranged in rows extending in the first direction 805.

As shown in top view 812 (taken along line B-B') and cross-sectional view 814 (taken along line A-A') of FIG. 8B, in other embodiments, the integrated chip may comprise a capacitor opening 816 having a substantially square shape that extends in the first direction 805 for a first distance 818 and in the second direction 806 for a second distance 820 that is substantially equal to the first distance 818. In some embodiments, the integrated chip may comprise an array of capacitor structures 118 arranged in rows extending in the first direction 805 and in columns extending in the second direction 806.

As shown in top view 822 (taken along line B-B') and cross-sectional view 824 (taken along line A-A') of FIG. 8C, in other embodiments, the integrated chip may comprise a capacitor opening 826 that is filled within one or more pillars 828 comprising the first plurality of layers 110 and the second plurality of layers 112. In such embodiments, the capacitor opening 826 is defined by an outer boundary that continuously extends in a closed path around the one or more pillars 828. The capacitor structure 118 continuously extends over tops of the one or more pillars 828 and along a space between the one or more pillars 828. In some embodiments, the capacitor structure 118 continuously extends in a closed loop around the one or more pillars 828.

FIGS. 9-20 illustrate cross-sectional views of some embodiments of a method of forming an integrated chip having a MIM capacitor structure within a capacitor opening having a variable width. Although FIGS. 9-20 are described in relation to a method, it will be appreciated that the structures disclosed in FIGS. 9-20 are not limited to such a method, but instead may stand alone as structures independent of the method.

Figures 9, 10:
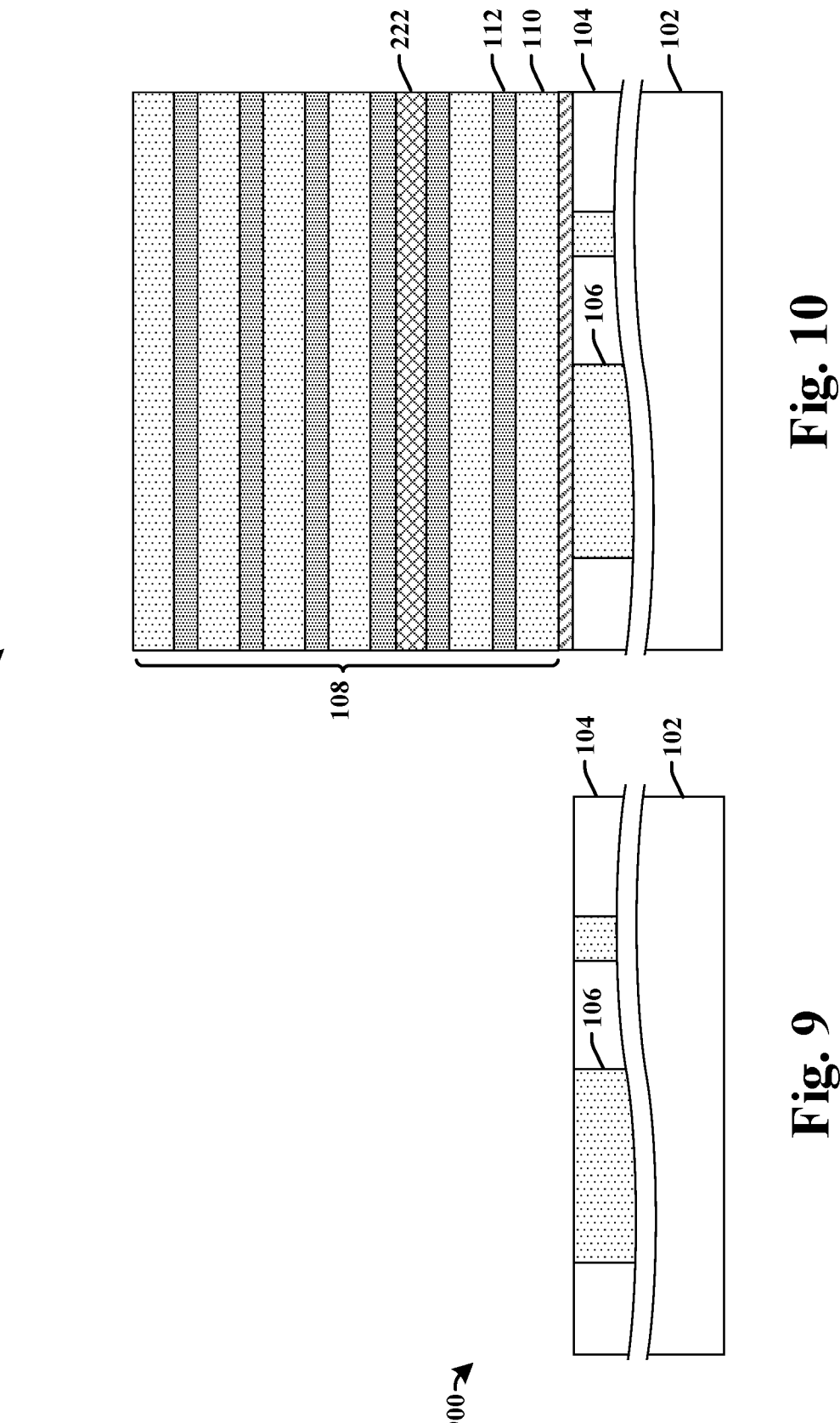
FIGS. 9-20 illustrate cross-sectional views of some embodiments of a method of forming an integrated chip having a MIM capacitor structure within a capacitor opening having a variable width.

As shown in cross-sectional view 900 of FIG. 9, one or more lower interconnects 106 are formed within a lower ILD structure 104 formed over a substrate 102. In various embodiments, the substrate 102 may be any type of semiconductor body (e.g., a silicon substrate, a germanium substrate, a III-V semiconductor substrate, a silicon-germanium (SiGe) substrate, an SOI substrate, or the like), such as a semiconductor wafer and/or one or more die on a wafer, as well as any other type of semiconductor and/or epitaxial layers, associated therewith. In some embodiments, the one or more lower interconnects 106 may comprise one or more of a middle-of-line (MOL) interconnect, a conductive contact, an interconnect wire, and/or an interconnect via.

In some embodiments, the one or more lower interconnects 106 may be respectively formed using a damascene process (e.g., a single damascene process or a dual damascene process). In such embodiments, the one or more lower interconnects 106 may be respectively formed by forming a lower inter-level dielectric (ILD) structure 104 over the substrate 102, selectively etching the lower ILD structure 104 to define a via hole and/or a trench within the lower ILD structure 104, forming a conductive material (e.g., copper, aluminum, etc.) within the via hole and/or the trench, and performing a planarization process (e.g., a chemical mechanical planarization (CMP) process) to remove excess of the conductive material from over the lower ILD structure 104.

As shown in cross-sectional view 1000 of FIG. 10, an etch stop layer 202 is formed over the lower ILD structure 104 and a dielectric stack 108 is formed over the etch stop layer 202. In some embodiments, the etch stop layer 202 may comprise a nitride (e.g., silicon nitride), a carbide (e.g., silicon carbide), or the like. In some embodiments, the dielectric stack 108 may comprises a first plurality of layers 110 and a second plurality of layers 112 interleaved between the first plurality of layers 110. The first plurality of layers 110 are a first dielectric material and the second plurality of layers 112 are a second dielectric material that is different than the first dielectric material. The first dielectric material and the second dielectric material have different etching selectivities with respect to an etchant. For example, the first dielectric material may have a first etching rate when exposed to an etchant and a second dielectric material may have a second etching rate when exposed to the etchant. In some embodiments, the first plurality of layers 110 may comprise an oxide, undoped silicate glass (USG), phosphosilicate glass, or the like. In some embodiments, the second plurality of layers 112 may comprise a nitride (e.g., silicon nitride, silicon oxynitride, etc.), a carbide (e.g., silicon carbide), boron silicate glass (BSG), borophosphosilicate glass (BPSG), or the like. In some embodiments, the first plurality of layers 110 and/or the second plurality of layers 112 may be formed to a thickness in a range of between approximately 5 nm and approximately 1 micron, between approximately 20 nm and approximately 200 nm, or the like. In some embodiments, the first plurality of layers 110 may be formed to a first thickness (e.g., in a range of between approximately 10 nm and approximately 40 nm) and the second plurality of layers 112 may be formed to a second thickness (e.g., in a range of between approximately 125 nm and 250 nm) that is greater than the first thickness. In some embodiments, a second etch stop layer 222 may be formed within the dielectric stack 108 between two or more of the first plurality of layers 110 and/or the second plurality of layers 112. In some embodiments, the first plurality of layers 110, the second plurality of layers 112, and the second etch stop layer 222 may be formed by a plurality of deposition processes (e.g., a PVD process, a CVD process, a PE-CVD process, an ALD process, or the like).

Figures 11, 12:
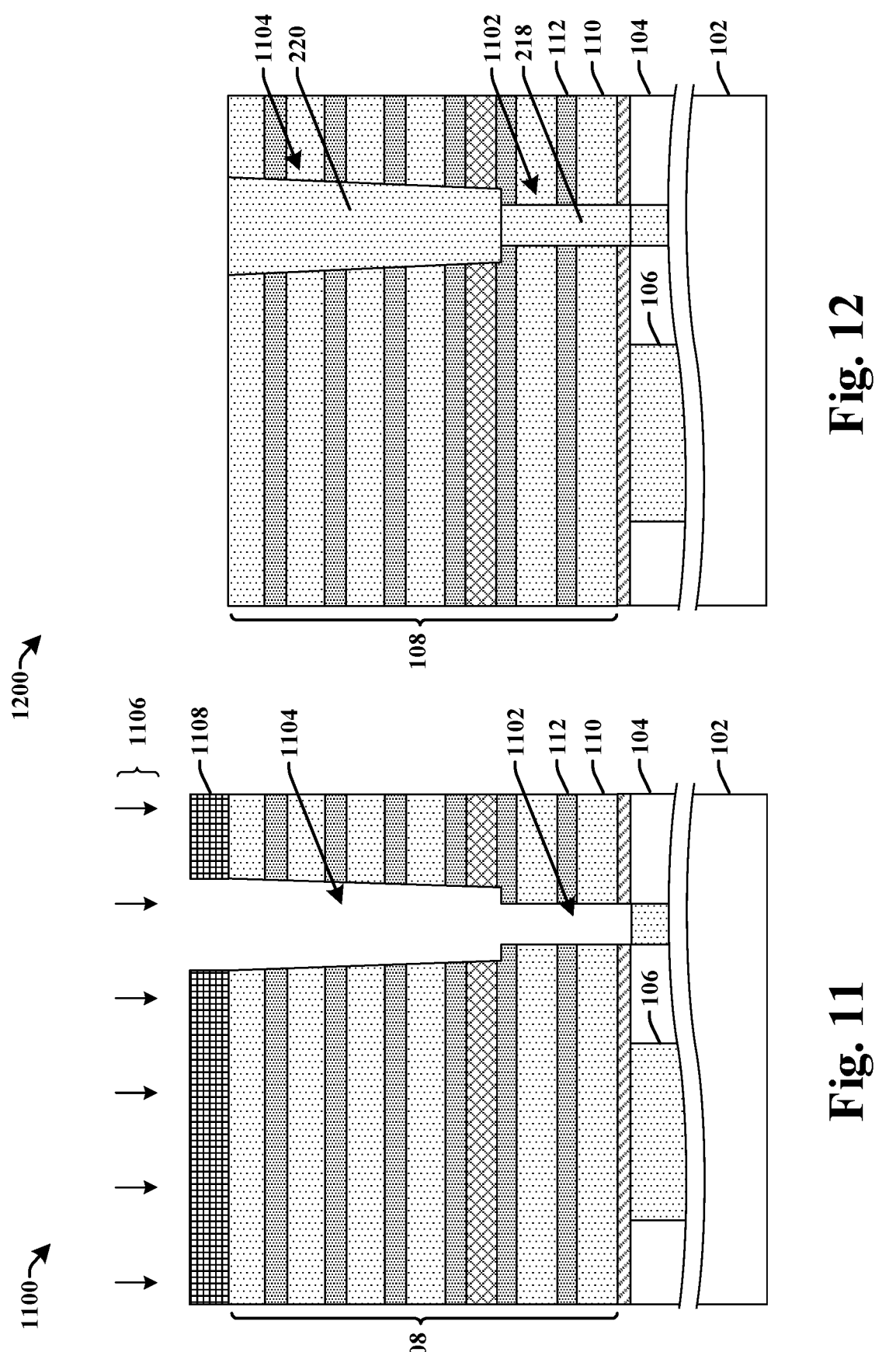

As shown in cross-sectional view 1100 of FIG. 11, a via hole 1102 and an interconnect trench 1104 are formed within the dielectric stack 108. The via hole 1102 extends through two or more of the first plurality of layers 110 and/or second plurality of layers 112. The interconnect trench 1104 also extends through two or more of the first plurality of layers 110 and/or second plurality of layers 112. In some embodiments, the via hole 1102 and the interconnect trench 1104 may be formed by exposing the dielectric stack 108 to one or more first etchants 1106 according to one or more first masks 1108. In some embodiments, the one or more first etchants 1106 may comprise a dry etchant (e.g., a reactive ion etching (RIE) etchant, a plasma etchant, or the like). In some embodiments, the one or more first etchants 1106 may have an etching chemistry comprising one or more of fluorine (F), tetrafluoromethane ($CF_4$), ozone ($O_2$), or octafluorocyclobutane ($C_4F_8$), or the like. In some embodiments, the one or more first masks 1108 may comprise a photosensitive material (e.g., photoresist), a hard mask, or the like.

As shown in cross-sectional view 1200 of FIG. 12, an interconnect via 218 may be formed within the via hole 1102 and an interconnect wire 220 is formed within the interconnect trench 1104. In some embodiments, the interconnect via 218 and the interconnect wire 220 may be formed by forming a conductive material within the via hole 1102 and the interconnect trench 1104. The conductive material is formed to fill the via hole 1102 and interconnect trench 1104 and to extend over the dielectric stack 108. In some embodiments, the conductive material may be formed using a deposition process and/or a plating process (e.g., electro-plating, electro-less plating, etc.) followed by a planarization process (e.g., a chemical mechanical polishing (CMP) process) to remove excess of the conductive material from over the dielectric stack 108. In some embodiments, the conductive material may comprise tungsten, copper, aluminum, or the like.

Figures 13, 14:
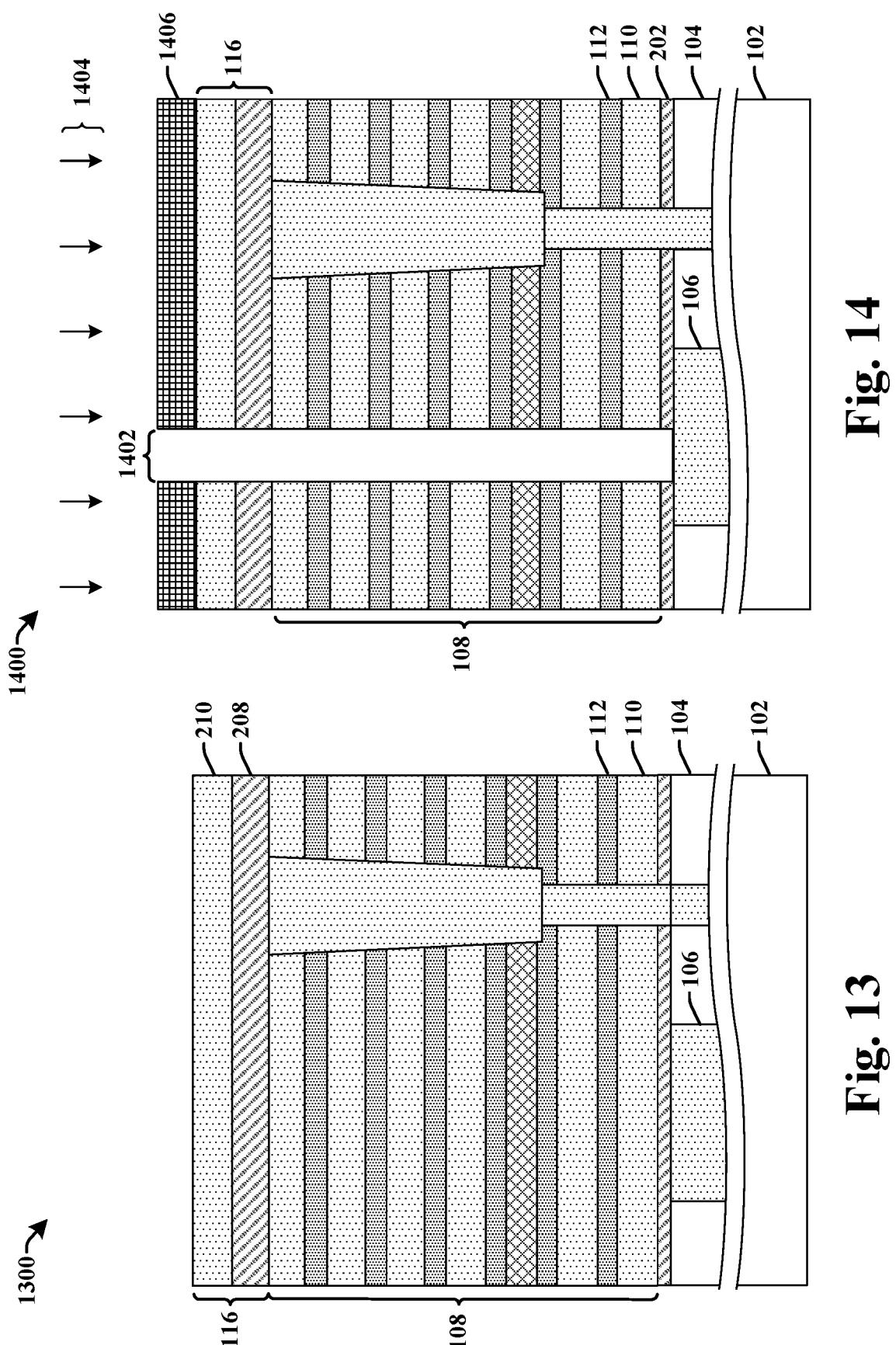

As shown in cross-sectional view 1300 of FIG. 13, a capping structure 116 is formed over the dielectric stack 108. In some embodiments, the capping structure 116 may comprise a first dielectric layer 208 and a second dielectric layer 210 over the first dielectric layer 208. In some embodiments, the first dielectric layer 208 may comprise a first dielectric material and the second dielectric layer 210 may comprise a second dielectric material. In some embodiments, the first dielectric layer 208 may comprise a carbide (e.g., silicon carbide) and the second dielectric layer 210 may comprise an oxide (e.g., silicon oxide). In some embodiments, the first dielectric layer 208 and a second dielectric layer 210 may be formed by a plurality of deposition processes (e.g., a PVD process, a CVD process, a PE-CVD process, an ALD process, or the like).

As shown in cross-sectional view 1400 of FIG. 14, a dry etching process is performed to define a preparatory opening 1402 that extends through the dielectric stack 108. The dry etching process etches the capping structure 116 and the dielectric stack 108. In some embodiments, the dry etching process exposes an upper surface of the etch stop layer. In some embodiments, the dry etching process may be performed by exposing the capping structure 116 and the dielectric stack 108 to a dry etchant 1404 according to a mask 1406. The dry etchant 1404 has a high degree of anisotropy, so as to give the preparatory opening 1402 steep sidewalls and a substantially constant width over a height of the preparatory opening 1402. In some embodiments, the dry etchant 1404 may comprise a fluorine based etching chemistry. For example, the dry etchant 1404 may have an etching chemistry comprising carbon tetrafluoride (CF4), trifluoromethane (CHF3), octafluorocyclobutane (C4F8), or the like. In other embodiments, the dry etchant 1404 may comprise an etching chemistry comprising chlorine (Cl2), HB4, Argon (Ar), or the like.

Figures 15, 16:
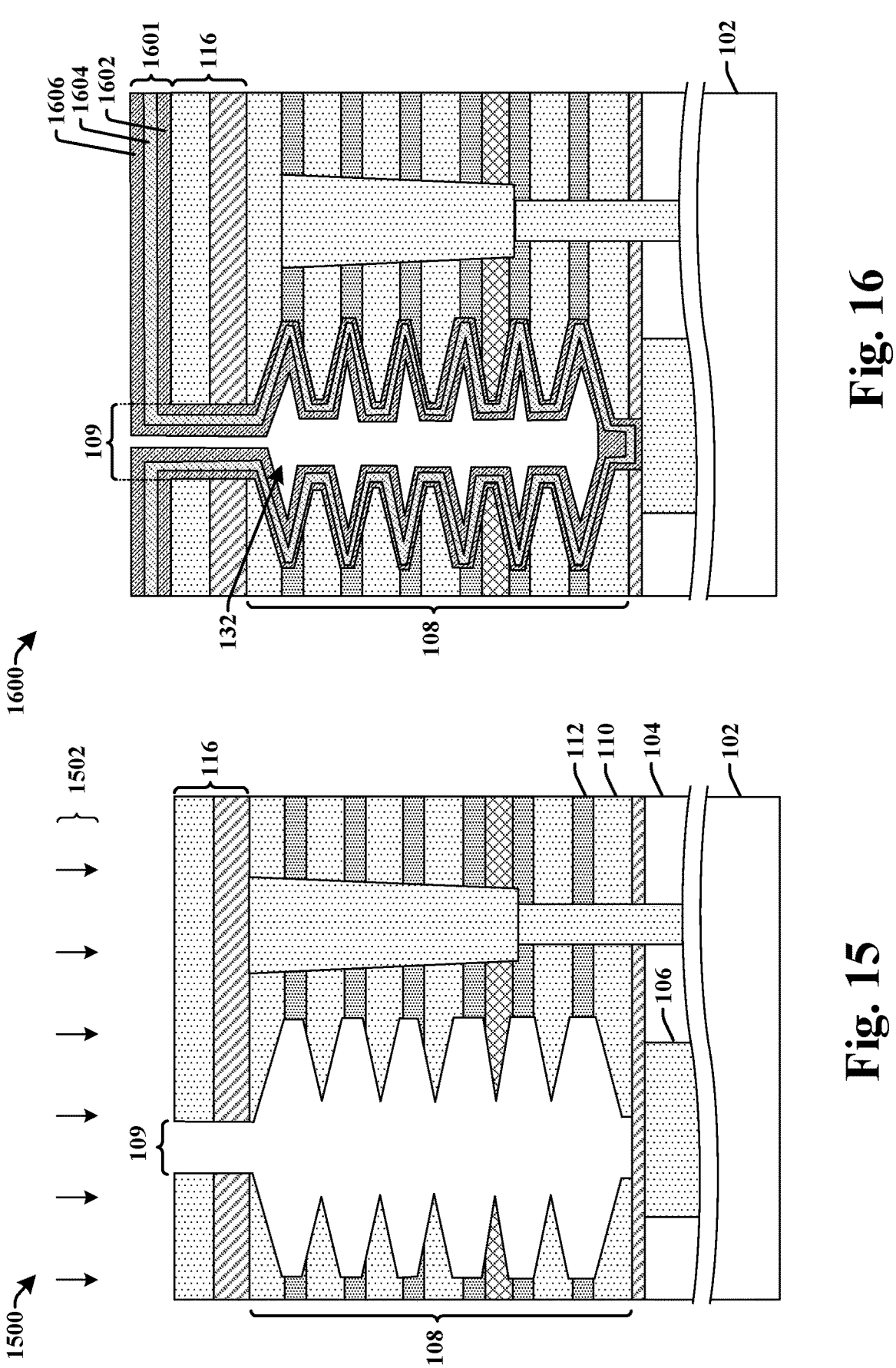

As shown in cross-sectional view 1500 of FIG. 15, a wet etching process is performed on sidewalls of the dielectric stack 108 that define the preparatory opening 1402 to form a capacitor opening 109. The wet etching process laterally etches the first plurality of layers 110 at a different rate than the second plurality of layers 112 to form the capacitor opening 109 to have opposing sides with serrated profiles. In some embodiments, the wet etching process may be configured to have an etching selectivity between the first plurality of layers 110 and the second plurality of layers 112, which is greater than approximately 100, greater than approximately 70, greater than approximately 5, or other similar values. The serrated profiles of the capacitor opening 109 give the capacitor opening 109 a variable width over a height of the capacitor opening 109. In some embodiments, the capacitor opening 109 may have a substantially rectangular shape as viewed from a top-view. In other embodiments, the capacitor opening 109 may have a substantially circular shape, a substantially square shape, or the like, as viewed from a top-view.

In some embodiments, the wet etching process may be performed by exposing the dielectric stack 108 to one or more wet etchants 1502. In some embodiments, the one or more wet etchants 1502 may comprise a first wet etchant configured to etch the first plurality of layers 110 and a second wet etchant configured to etch the second plurality of layers. In some embodiments, the first wet etchant may comprise hydrofluoric acid (HF) (e.g., liquid based HF or vapor based HF) and/or a buffered oxide etch (BOE) and the second wet etchant may comprise phosphoric acid ($H_3PO_4$) in a chemical downstream etching (CDE) process. In various embodiments, the first wet etchant comprising HF and/or BOE may etch an oxide layer and stop on a nitride layer (e.g., a silicon nitride layer, a silicon oxynitride layer, or the like), may etch an oxide layer and stop on a carbide layer (e.g., a silicon carbide layer, a silicon oxycaride layer, or the like), or may etch a phosphosilicate glass (PSG) or an undoped silicate glass (USG) and stop on a borosilicate glass (BSG) or a borophosphosilicate glass (BPSG). In various embodiments, the second wet etchant comprising $H_3PO_4$ in a CDE process may etch the nitride layer, the carbide layer, the BSG layer, or the BPSG layer.

As shown in cross-sectional view 1600 of FIG. 16, capacitor layers 1601 are formed within the capacitor opening 109. The capacitor layers 1601 have one or more interior surfaces facing one another. The one or more interior surfaces define a cavity 132 that separates the one or more interior surfaces from one another. The capacitor layers 1601 may be formed by forming a first electrode layer 1602 along the one or more surfaces of the dielectric stack 108 defining the capacitor opening 109, by forming a capacitor dielectric layer 1604 on the first electrode layer 1602, and by forming a second electrode layer 1606 on the capacitor dielectric layer 1604. In some embodiments, the first electrode layer 1602, the capacitor dielectric layer 1604, and the second electrode layer 1606 may be formed by a plurality of atomic layer deposition processes, by way of a plurality of PVD processes, or the like).

Figures 17, 18:
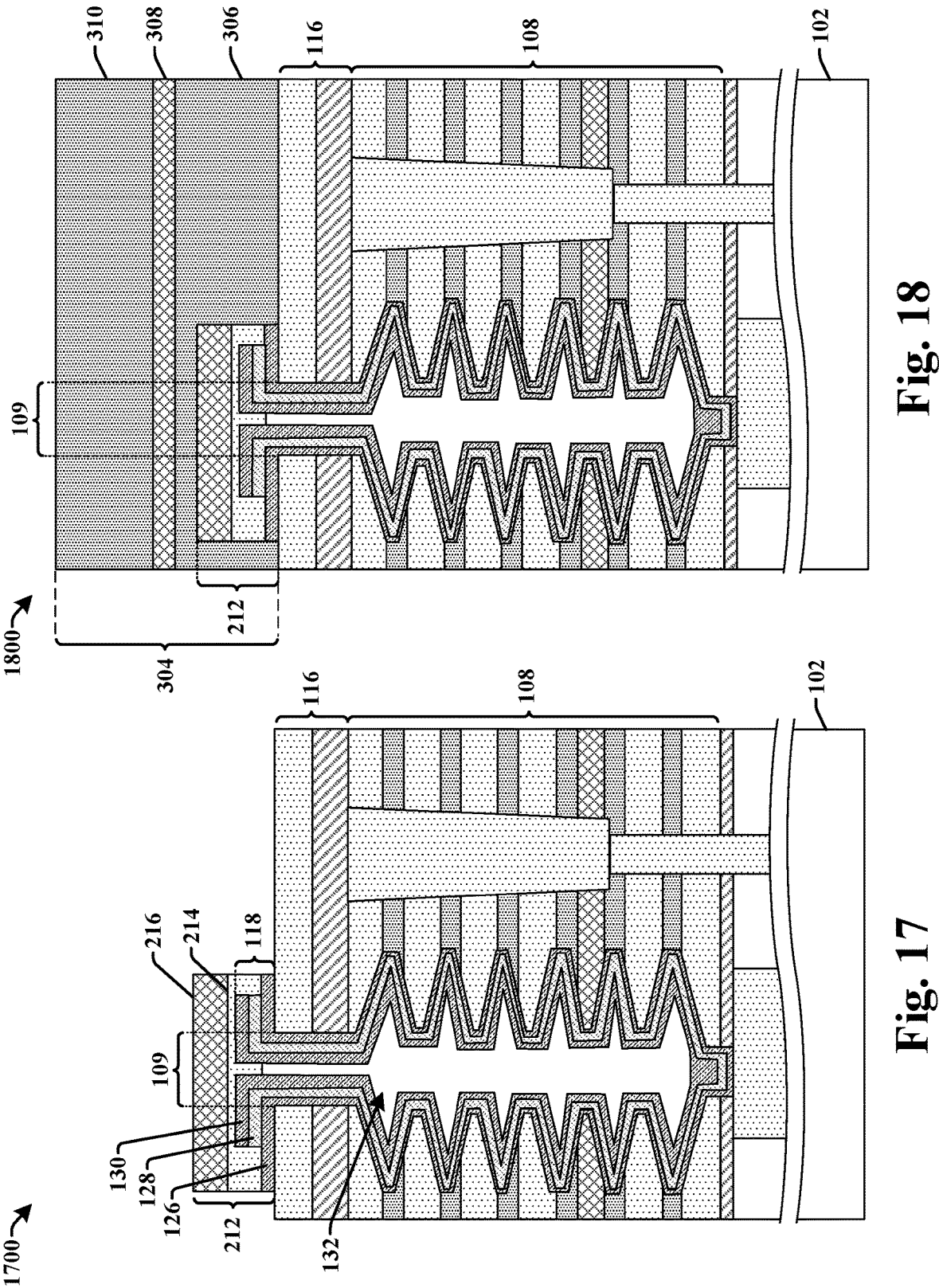

As shown in cross-sectional view 1700 of FIG. 17, the capacitor layers (1601 of FIG. 16) are patterned to define a capacitor structure 118 within the capacitor opening 109. The capacitor structure comprises a first electrode 126 separated from a second electrode 130 by a capacitor dielectric 128. In some embodiments, a stopper 212 is formed onto the capacitor structure 118. The stopper 212 covers an aperture defined by sidewalls of the capacitor structure 118 and extends to over uppermost surfaces of the capacitor structure 118. In some embodiments, the stopper 212 may comprise a first dielectric material 214 and an overlying second dielectric material 216. For example, in some embodiments, the first dielectric material 214 comprises an oxide and the second dielectric material 216 comprises a nitride (e.g., silicon nitride, silicon oxynitride, or the like).

In some embodiments, one or more patterning processes are performed to remove parts of the stopper 212, the first electrode layer (1602 of FIG. 16), the capacitor dielectric layer (1604 of FIG. 16), and the second electrode layer (1606 of FIG. 16) from over the capping structure 116. In some embodiments, the one or more patterning processes cause the first electrode 126 to extend past outer sidewalls of the capacitor dielectric 128 and/or the second electrode 130. In some embodiments, the one or more patterning processes may be performed by using a photolithography process to form one or more masking layers (e.g., a photosensitive material, a hard mask, or the like) over the first electrode layer (1602 of FIG. 16), the capacitor dielectric layer (1604 of FIG. 16), and the second electrode layer (1606 of FIG. 16) and subsequently exposing the first electrode layer, the capacitor dielectric layer, and/or the second electrode layer to one or more etchants according to the one or more masking layers.

As shown in cross-sectional view 1800 of FIG. 18, an upper ILD structure 304 is formed over the dielectric stack 108 and the capping structure 116. The upper ILD structure 304 may comprise one or more dielectric material stacked over the dielectric stack 108. In some embodiments, the upper ILD structure 304 may comprise a first upper ILD layer 306 separated from a second upper ILD layer 310 by an upper etch stop layer 308. In some embodiments, the upper ILD structure 304 may be formed by way of one or more deposition processes (e.g., a PVD process, a CVD process, a PE-CVD process, an ALD process, or the like).

Figures 19, 20:
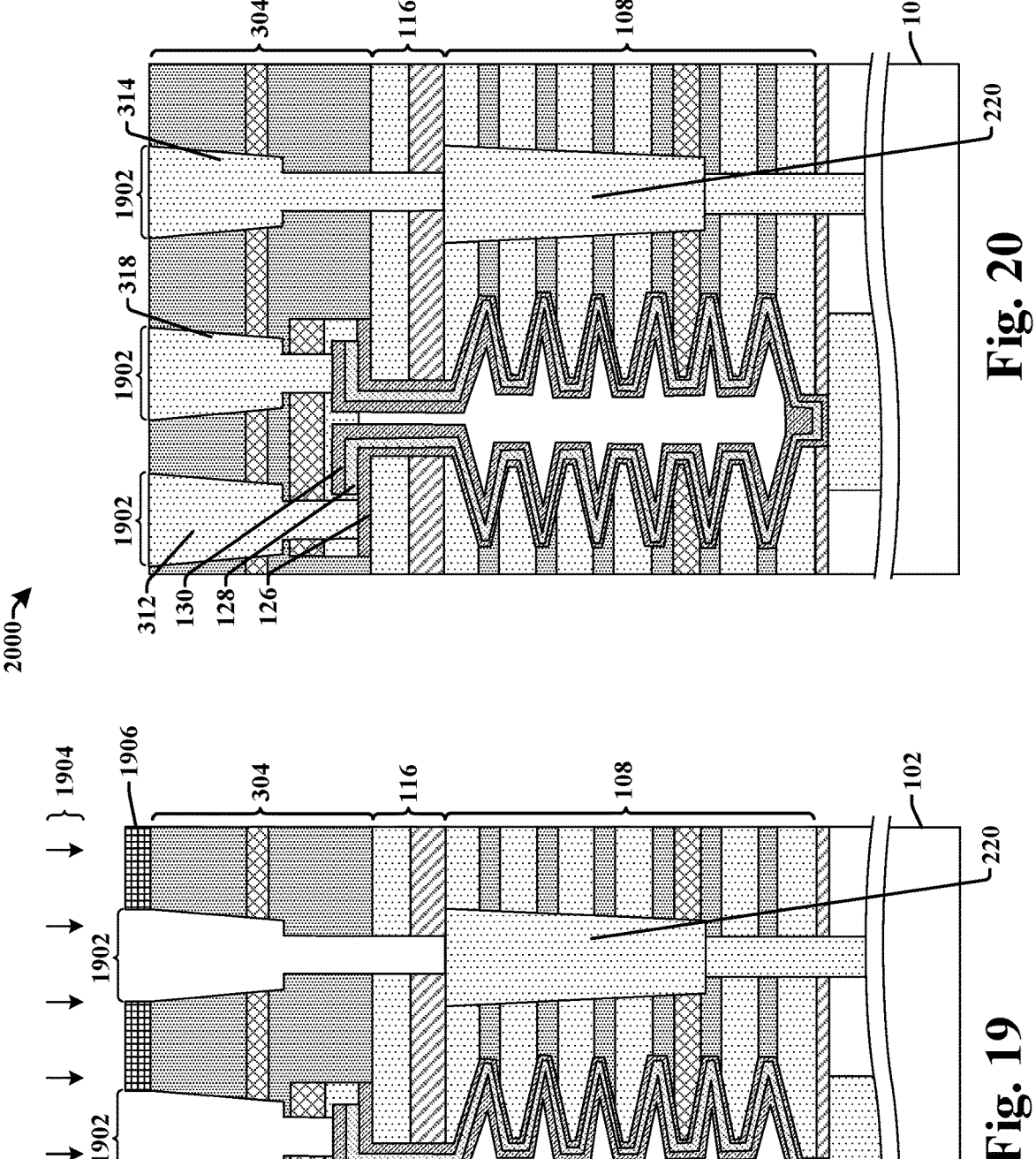

As shown in cross-sectional view 1900 of FIG. 19, a plurality of upper interconnect openings 1902 are formed in the upper ILD structure 304. The plurality of upper interconnect openings 1902 extend through the upper ILD structure 304 and/or the stopper 212 to expose an upper surface of the second electrode 130 and to expose the interconnect wire 220. In some embodiments, the one or more upper interconnect openings 1902 may further extend through the upper ILD structure 304 and/or the stopper 212 to expose an upper surface of first electrode 126. In some embodiments, the plurality of upper interconnect openings 1902 may be formed by selectively exposing the upper ILD structure 304 to one or more additional etchants 1904 according to an additional mask 1906. In some embodiments, the one or more additional etchants 1904 may comprise a plasma etchant having an etching chemistry comprising one or more of fluorine (F), tetrafluoromethane ($CF_4$), ozone ($O_2$), or octafluorocyclobutane ($C_4F_8$), or the like. In some embodiments, the additional mask 1906 may comprise a photosensitive material (e.g., photoresist), a hard mask, or the like.

As shown in cross-sectional view 2000 of FIG. 20, a plurality of upper interconnects are formed within the plurality of upper interconnect openings 1902. In some embodiments, the plurality of upper interconnects may comprise a first upper interconnect 312 disposed on the first electrode 126 and an additional upper interconnect 314 disposed on the interconnect wire 220. In some embodiments, the plurality of upper interconnects may further comprise a second upper interconnect 318 disposed on the second electrode 130. In some embodiments, the plurality of upper interconnects may be formed by forming a conductive material within the one or more upper interconnect openings 1902. In some embodiments, the conductive material may be formed by way of a deposition process and/or a plating process (e.g., electroplating, electro-less plating, etc.). In various embodiments, the conductive material may comprise copper, aluminum, or the like. After forming the conductive material within the upper interconnect opening 1902, a planarization process may be performed to remove excess of the conductive material from over the upper ILD structure 304 and to define the plurality of upper interconnects.

FIG. 21 illustrates a flow diagram of some embodiments of a method 2100 of forming an integrated chip having a MIM capacitor structure within a capacitor opening having a variable width.

While the disclosed method 2100 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 2102, a lower interconnect is formed within a lower inter-level dielectric (ILD) structure over a substrate. FIG. 9 illustrates a cross-sectional view 900 of some embodiments corresponding to act 2102.

At act 2104, a dielectric stack is formed, over the lower ILD structure, to have a first plurality of layers interleaved between a second plurality of layers. FIG. 10 illustrates a cross-sectional view 1000 of some embodiments corresponding to act 2104.

At act 2106, one or more interconnects are formed within the dielectric stack. FIGS. 11-12 illustrate cross-sectional views 1100-1200 of some embodiments corresponding to act 2106.

At act 2108, a capping structure is formed over the dielectric stack. FIG. 13 illustrates a cross-sectional view 1300 of some embodiments corresponding to act 2108.

At act 2110, a dry etching process is performed to form a preparatory opening extending through the capping structure and the dielectric stack. FIG. 14 illustrates a cross-sectional view 1400 of some embodiments corresponding to act 2110.

At act 2112, a wet etching process is performed on sidewalls of the stack structure defining the preparatory opening to define a capacitor opening having a variable width over a height of the capacitor opening. FIG. 15 illustrates a cross-sectional view 1500 of some embodiments corresponding to act 2112.

At act 2114, a capacitor structure is formed along surfaces of the dielectric stack defining the capacitor opening. FIG. 16 illustrates a cross-sectional view 1600 of some embodiments corresponding to act 2114.

At act 2116, a stopper is formed over an upper surface and sidewalls of the capacitor structure. FIG. 17 illustrates a cross-sectional view 1700 of some embodiments corresponding to act 2116.

At act 2118, a plurality of upper are formed within an upper ILD structure formed over the capping structure and the stopper. FIGS. 18-20 illustrate cross-sectional views 1800-2000 of some embodiments corresponding to act 2118.

Accordingly, in some embodiments, the present disclosure relates to an integrated chip having a MIM capacitor structure disposed within a capacitor opening having a variable width that oscillates between smaller and larger widths over a height of the capacitor opening.

In some embodiments, the present disclosure relates to an integrated chip. The integrated chip includes a dielectric stack disposed over a substrate and having a first plurality of layers interleaved between a second plurality of layers, the dielectric stack having one or more surfaces that define a plurality of indentations recessed into a side of the dielectric stack at different vertical heights corresponding to the second plurality of layers; and a capacitor structure lining the one or more surfaces of the dielectric stack, the capacitor structure having conductive electrodes separated by a capacitor dielectric.

In other embodiments, the present disclosure relates to an integrated chip. The integrated chip includes a dielectric stack disposed over a substrate and having a first plurality of layers of a first material interleaved between a second plurality of layers of a second material, the dielectric stack having one or more surfaces defining a capacitor opening; a capacitor structure lining the one or more surfaces of the dielectric stack defining the capacitor opening, the capacitor structure having a plurality of protrusions extending outward from a sidewall of the capacitor structure to a maximum extension defined by the second plurality of layers; and the capacitor structure having interior surfaces defining a cavity separating the interior surfaces.

In yet other embodiments, the present disclosure relates to a method of forming an integrated chip. The method includes forming a dielectric stack over a substrate, the dielectric stack formed to have a first plurality of layers of a first material interleaved between a second plurality of layers of a second material; performing a dry etching process to define a preparatory opening that extends through the dielectric stack; performing a wet etching process on sidewalls of the dielectric stack that define the preparatory opening, the wet etching process laterally etching the first material at a different rate than the second material to form a capacitor opening having a side with a serrated profile; and forming a capacitor structure to line surfaces of the dielectric stack defining the capacitor opening.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip, comprising:
a dielectric stack disposed over a substrate and comprising a first plurality of layers interleaved between a second plurality of layers, wherein the dielectric stack has one or more surfaces that form a plurality of indentations recessed into a side of the dielectric stack at different vertical heights corresponding to the second plurality of layers and wherein the plurality of indentations have depths that increase as a vertical distance from the substrate increases; and
a capacitor structure lining the one or more surfaces of the dielectric stack, wherein the capacitor structure comprises conductive electrodes separated by a capacitor dielectric.

2. The integrated chip of claim 1, wherein the capacitor structure has surfaces separated by a cavity, the cavity having a first width between sidewalls of a first layer of the first plurality of layers and a second width between sidewalls of a second layer of the second plurality of layers, the second width different than the first width.

3. The integrated chip of claim 2, further comprising:
a stopper continuously extending over the cavity and past sidewalls of the capacitor structure arranged along a top of the cavity.

4. The integrated chip of claim 2, wherein one or more of the surfaces of the capacitor structure are angled at an acute angle measured through the cavity and with respect to a line extending along a bottom of a first one of the first plurality of layers.

5. The integrated chip of claim 2, wherein the plurality of indentations respectively have a tapered height as viewed in a cross-sectional view, the tapered height decreasing as a lateral distance from a center of the cavity increases.

6. The integrated chip of claim 1, wherein the first plurality of layers and the second plurality of layers comprise different silicate glasses.

7. The integrated chip of claim 1, further comprising:
an interconnect via extending through at least two of the first plurality of layers; and
an interconnect wire contacting a top of the interconnect via and extending through at least two of the first plurality of layers.

8. The integrated chip of claim 1, wherein the second plurality of layers comprise a first trapezoidal shaped segment disposed laterally between the capacitor structure and an additional capacitor structure and a second trapezoidal shaped segment disposed over the first trapezoidal shaped segment and laterally between the capacitor structure and the additional capacitor structure.

9. The integrated chip of claim 1,
wherein the plurality of indentations are formed by a curved surface of the dielectric stack; and
wherein the dielectric stack comprises a substantially straight surface extending between vertically neighboring ones of the plurality of indentations.

10. The integrated chip of claim 1, wherein one of the conductive electrodes continuously extends from within the dielectric stack to over a top surface of the dielectric stack.

11. An integrated chip, comprising:
a dielectric stack disposed over a substrate and comprising a first plurality of layers of a first material interleaved between a second plurality of layers of a second material, wherein the dielectric stack comprises one or more surfaces defining a capacitor opening;
a capacitor structure lining the one or more surfaces of the dielectric stack defining the capacitor opening, wherein the capacitor structure has a plurality of protrusions extending outward from a sidewall of the capacitor structure to a maximum extension defined by the second plurality of layers; and
wherein the capacitor structure has interior surfaces defining a cavity separating the interior surfaces.

12. The integrated chip of claim 11, wherein the capacitor structure comprises a first electrode separated from a second electrode by a capacitor dielectric.

13. The integrated chip of claim 12, further comprising:
a first upper interconnect disposed on an upper surface of the first electrode, the upper surface over a top of the dielectric stack; and
a second upper interconnect disposed on an upper surface of the second electrode, the upper surface of the second electrode over the top of the dielectric stack.

14. The integrated chip of claim 11, wherein the plurality of protrusions have a rounded profile as viewed along a cross-sectional view of the capacitor structure.

15. The integrated chip of claim 11, further comprising:
a lower inter-level dielectric (ILD) structure arranged between the dielectric stack and the substrate; and
a lower interconnect disposed within the lower ILD structure below the capacitor structure.

16. The integrated chip of claim 15, further comprising:
an etch stop layer separating the lower ILD structure from the dielectric stack, wherein the capacitor structure extends through the etch stop layer to a bottom surface that contacts the lower interconnect.

17. The integrated chip of claim 11, further comprising:

a lower ILD structure arranged between the dielectric stack and the substrate; and an etch stop layer separating the lower ILD structure from the dielectric stack, wherein the capacitor structure is above an upper surface of the etch stop layer.

18. The integrated chip of claim 11, further comprising:

an interconnect wire extending through at least two of the first plurality of layers;

a first interconnect via contacting the capacitor structure; and a second interconnect via contacting the interconnect wire, wherein the second interconnect via vertically extends below a bottom of the first interconnect via.

19. The integrated chip of claim 11, further comprising:

an interconnect via extending through at least two of the first plurality of layers;

an interconnect wire disposed over the interconnect via and contacting the interconnect via along an interface; and wherein the capacitor structure extends from below the interface to above the interface.

20. An integrated chip, comprising:

a dielectric stack disposed over a substrate and comprising a first plurality of layers interleaved between a second plurality of layers, wherein the dielectric stack has one or more surfaces that form a plurality of indentations recessed into a side of the dielectric stack at different vertical heights corresponding to the second plurality of layers;

a capacitor structure lining the one or more surfaces of the dielectric stack;

wherein the first plurality of layers comprise a first layer having a first thickness directly over an upper surface of an immediately underlying one of the second plurality of layers and a second non-zero thickness laterally outside of the upper surface, the first thickness being larger than the second non-zero thickness;

wherein the dielectric stack further comprises an etch stop layer disposed between adjacent ones of the first plurality of layers, the etch stop layer comprising a different material than both the first plurality of layers and the second plurality of layers; and wherein the capacitor structure vertically extends from below a bottom of the etch stop layer to above a top of the etch stop layer.

* * * * *